US007869246B2

(12) United States Patent
Sutardja

(10) Patent No.: US 7,869,246 B2
(45) Date of Patent: *Jan. 11, 2011

(54) BIT LINE DECODER ARCHITECTURE FOR NOR-TYPE MEMORY ARRAY

(75) Inventor: Pantas Sutardja, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 228 days.

This patent is subject to a terminal disclaimer.

(21) Appl. No.: 12/127,326

(22) Filed: May 27, 2008

(65) Prior Publication Data

US 2008/0291741 A1 Nov. 27, 2008

Related U.S. Application Data

(60) Provisional application No. 60/940,206, filed on May 25, 2007.

(51) Int. Cl.
G11C 17/00 (2006.01)
G11C 8/00 (2006.01)

(52) U.S. Cl. .................. 365/94; 365/104; 365/185.05; 365/185.17; 365/230.06

(58) Field of Classification Search ............ 365/230.03, 365/230.06, 205, 207, 208, 185.05, 185.17, 365/94, 104
See application file for complete search history.

(56) References Cited

U.S. PATENT DOCUMENTS 5,202,848 A * 4/1993 Nakagawara ................ 365/104

(Continued)

FOREIGN PATENT DOCUMENTS

EP 0905705 3/1999

OTHER PUBLICATIONS

International Search Report and the Written Opinion of the International Searching Authority, or the Declaration mailed Sep. 3, 2008 for International Application No. PCT/US2008/064881filed May 27, 2008; 12 pages.

*Primary Examiner*—Trong Phan

(57) ABSTRACT

A bit line decoder includes control devices that selectively communicate with bit lines and that are arranged in a multi-level configuration having a plurality of levels. Each of the levels includes a plurality of the control devices connected to each other in series forming one or more junctions. Each of the one or more junctions in one of the levels is directly connected to a respective one of the bit lines. A control module selects from the bit lines a first bit line and a second bit line associated with a memory cell when determining a state of the memory cell and generates first control signals that deselect one or more of the control devices at each of the levels. When the one or more control devices at each of the levels are deselected, a first group of the bit lines including the first bit line is charged to a first potential and a second group of the bit lines including the second bit line is charged to a second potential. An isolation circuit to isolate a first one of the levels from a second one of the levels includes a plurality of isolation devices having first ends that communicate with the control devices of the first one of the levels and second ends that communicate with the control devices of the second one of the levels.

55 Claims, 19 Drawing Sheets

U.S. PATENT DOCUMENTS

| | | | |
|---|---|---|---|
| 5,268,861 A * | 12/1993 | Hotta | 365/104 |
| 5,457,661 A * | 10/1995 | Tomita et al. | 365/230.06 |
| 5,506,813 A * | 4/1996 | Mochizuki et al. | 365/104 |
| 5,732,013 A * | 3/1998 | Von Basse et al. | 365/104 |
| 5,822,268 A | 10/1998 | Kirihata | |
| 6,226,214 B1 * | 5/2001 | Choi | 365/104 |
| 6,643,172 B2 * | 11/2003 | Ogura | 365/230.06 |
| 6,788,612 B2 * | 9/2004 | Hsu et al. | 365/230.06 |
| 6,876,596 B1 * | 4/2005 | Kirihara | 365/230.06 |
| 6,920,058 B2 * | 7/2005 | Morikawa | 365/94 |
| 6,958,949 B2 * | 10/2005 | Confalonieri et al. | 365/230.06 |
| 7,394,719 B2 * | 7/2008 | Lee et al. | 365/230.06 |
| 7,633,829 B2 * | 12/2009 | Fasoli et al. | 365/230.06 |
| 2002/0048210 A1 | 4/2002 | Tomotani | |

\* cited by examiner

| | | | | | | | | |
|---|---|---|---|---|---|---|---|---|
| BL8 | V2 | V2 | V2 | V2 | V2 | V2 | V2 | V2 |
| BL7 | V2 | V2 | V2 | V2 | V2 | V2 | V2 | V1 |
| BL6 | V2 | V2 | V2 | V2 | V2 | V2 | V1 | V1 |
| BL5 | V2 | V2 | V2 | V2 | V2 | V1 | V1 | V1 |
| BL4 | V2 | V2 | V2 | V2 | V1 | V1 | V1 | V1 |
| BL3 | V2 | V2 | V2 | V1 | V1 | V1 | V1 | V1 |
| BL2 | V2 | V2 | V1 | V1 | V1 | V1 | V1 | V1 |
| BL1 | V2 | V1 | V1 | V1 | V1 | V1 | V1 | V1 |
| BL0 | V1 | V1 | V1 | V1 | V1 | V1 | V1 | V1 |
| C0 | 0 | 1 | 0 | 1 | 0 | 1 | 0 | 1 |
| C1 | 0 | 0 | 1 | 1 | 0 | 0 | 1 | 1 |
| C2 | 0 | 0 | 0 | 0 | 1 | 1 | 1 | 1 |

FIG. 5C

| | | | | | | | | |
|---|---|---|---|---|---|---|---|---|
| BL8 | V2 | V2 | V2 | V2 | V2 | V2 | V2 | V2 |
| BL7 | V2 | V2 | V2 | V2 | V2 | V2 | V2 | V1 |
| BL6 | V2 | V2 | V2 | V2 | V2 | V2 | V1 | V1 |
| BL5 | V2 | V2 | V2 | V2 | V2 | V1 | V1 | V1 |
| BL4 | V2 | V2 | V2 | V2 | V1 | V1 | V1 | V1 |
| BL3 | V2 | V2 | V2 | V1 | V1 | V1 | V1 | V1 |
| BL2 | V2 | V2 | V1 | V1 | V1 | V1 | V1 | V1 |
| BL1 | V2 | V1 | V1 | V1 | V1 | V1 | V1 | V1 |
| BL0 | V1 | V1 | V1 | V1 | V1 | V1 | V1 | V1 |
| C00 | 0 | 1 | 1 | 1 | 0 | 1 | 1 | 1 |
| C01 | 1 | 0 | 1 | 1 | 1 | 0 | 1 | 1 |
| C02 | 1 | 1 | 0 | 1 | 1 | 1 | 0 | 1 |
| C03 | 1 | 1 | 1 | 0 | 1 | 1 | 1 | 0 |
| C2B | 1 | 1 | 1 | 1 | 0 | 0 | 0 | 0 |
| C2 | 0 | 0 | 0 | 0 | 1 | 1 | 1 | 1 |

FIG. 6B

BIT LINE DECODER ARCHITECTURE FOR NOR-TYPE MEMORY ARRAY

CROSS-REFERENCE TO RELATED APPLICATIONS

This application claims the benefit of U.S. Provisional Application No. 60/940,206, filed on May 25, 2007. The disclosure of the above application is incorporated herein by reference in its entirety.

FIELD

The present disclosure relates to memory integrated circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor memory (memory) packaged in integrated circuits (ICs) is typically organized in the form of memory arrays. Memory arrays that comprise NAND-type or NOR-type memory cells (e.g., NAND-type or NOR-type Flash memory cells) are called NAND-type or NOR-type memory arrays, respectively. Memory arrays comprise memory cells arranged in rows and columns. Memory arrays comprise decoder circuits (decoders) that select word lines (WLs) and bit lines (BLs) to read/write data in the memory cells.

Referring now to FIG. 1, an IC 10 comprising a memory array 12, a WL decoder 16, and a BL decoder 18 is shown. The memory array 12 comprises memory cells 14 arranged in rows and columns as shown. During read/write operations, depending on the address of a selected memory cell 14, the WL and BL decoders 16, 18 activate appropriate WLs and BLs, respectively, to read/write data from/to the selected memory cell 14.

Referring now to FIG. 2, an exemplary NOR-type memory array 50 utilizing a buried bit line architecture is shown. A state of an $n^{th}$ memory cell 52 in the NOR-type memory array 50 is typically measured as follows. A WL decoder 51 selects a word line WL(n) and deselects a word line WL(n+1). A sensing circuit 54 applies a potential difference (V2−V1) across adjacent bit lines BL(n) and BL(n+1) that connect directly to the $n^{th}$ memory cell 52. The sensing circuit 54 senses and measures a current I that flows through the $n^{th}$ memory cell 52. A value of the current I depends on the state of the $n^{th}$ memory cell 52. The state of the $n^{th}$ memory cell 52 can be determined based on the value of the current I.

Typically, a pair of decoders may be used to select different pairs of adjacent bit lines that connect to different memory cells of memory arrays. The decoders may apply the potential difference (V2−V1) across the selected pairs, measure the current that flows through the selected memory cells, and determine the state of the memory cells.

Referring now to FIG. 3, an exemplary integrated circuit 70 comprising a NOR-type memory array 72, a WL decoder 74, a decoder 76, a decoder 78, and a sensing circuit 80 is shown. The decoders 76 and 78 are 1-of-N decoders, where N is an integer greater than 1 (e.g., N=8). The decoders 76 and 78 select different pairs of adjacent bit lines that connect to different memory cells of the NOR-type memory array 72. The decoders 76 and 78 apply the potential difference (V2−V1) across the memory cells connected to the selected bit lines. The sensing circuit 80 measures the current that flows through the memory cells. Thus, states of all the memory cells of the NOR-type memory array 72 can be determined.

SUMMARY

A bit line decoder for sensing states of memory cells of a memory array comprises control devices and a control module. The control devices selectively communicate with bit lines and are arranged in a multi-level configuration having a plurality of levels, each level having a plurality of the control devices. The control module selects from the bit lines a first bit line and a second bit line associated with a memory cell located in the memory array when determining a state of the memory cell and generates first control signals that deselect one or more of the control devices at each level. When one or more control devices at each level are deselected, a first group of the bit lines including the first bit line is charged to a first potential and a second group of the bit lines including the second bit line is charged to a second potential.

In another feature, the bit line decoder further comprises a sensing circuit that applies the first potential to the first group of the bit lines and the second potential to the second group of the bit lines. The sensing circuit senses current that flows through the memory cell and determines the state of the memory cell based on the current.

In another feature, a first number of the control devices associated with a first of the levels is greater than a second number of the control devices associated with a second of the levels.

In another feature, the first of the levels is located farther from the sensing circuit than the second of the levels.

In another feature, when a first of the levels is adjacent to a second of the levels, a first number of the control devices associated with the first of the levels is twice a second number of the control devices associated with the second of the levels.

In another feature, the first control signals deselect half of the control devices associated with each level.

In another feature, the bit line decoder further comprises an isolation circuit that is disposed between a first level and a second level of the levels.

In other features, the control module generates second control signals that control the isolation circuit. The isolation circuit isolates the control devices associated with the first level from the control devices associated with the second level based on the second control signals.

In another feature, an integrated circuit (IC) comprises the bit line decoder and further comprises the memory array.

In still other features, a bit line decoder for sensing states of memory cells of a memory array comprises control devices and a control module. The control devices are arranged in L levels of the bit line decoder, where L is an integer greater than 2. A $K^{th}$ of the L levels includes $2^K$ of the control devices, where $1 \leq K \leq L$. The control devices selectively communicate with B bit lines of the memory array, where $B=(2^L+1)$. The control module generates first control signals that deselect half of the control devices in each of the L levels and that select two of the B bit lines that communicate with one of the memory cells.

In another feature, the bit line decoder further comprises a sensing circuit that communicates with the control devices, that applies a potential difference across the two of the B bit lines. The sensing circuit senses current that flows through one of the memory cells and determines a state of one of the memory cells based on the current.

In other features, the bit line decoder further comprises a sensing circuit that communicates with the control devices, that applies a first potential to M of the B bit lines that are on a first side of one of the memory cells, and that applies a second potential to N of the B bit lines that are on a second side of one of the memory cells, where M and N are integers greater than or equal to 1, and (M+N)=B. The sensing circuit senses current that flows through one of the memory cells and determines a state of one of the memory cells based on the current.

In other features, a first of the L levels includes a greater number of the control devices than a second of the L levels. The first of the L levels is located farther from the sensing circuit than the second of the L levels.

In another feature, P of the L levels are arranged in a first sub-decoder that is adjacent to the memory array, and Q of the L levels are arranged in a second sub-decoder that is adjacent to the sensing circuit, where P and Q are integers greater than or equal to 1, and (P+Q)=L.

In another feature, the bit line decoder further comprises an isolation circuit that includes a plurality of isolation devices each having first ends that communicate with the first sub-decoder and second ends that communicate with the second sub-decoder.

In other features, the control module generates second control signals that control the isolation devices. The isolation devices isolate the first sub-decoder from the second sub-decoder based on the second control signals.

In another feature, the sensing circuit determines a state of one of the memory cells when the isolation devices do not isolate the first sub-decoder from the second sub-decoder.

In another feature, an integrated circuit (IC) comprises the bit line decoder and further comprises the memory array.

In still other features, a bit line decoder for sensing states of memory cells of a memory array comprises a first sub-decoder, a control module, and an isolation circuit. The first sub-decoder includes first control devices arranged in P of L levels of the bit line decoder, where L is an integer greater than 2, and P<L. The first control devices selectively communicate with a first set of S of B bit lines of the memory array, where $S=(2^L+1)$, and S<B. A $K^{th}$ of the L levels includes $2^K$ control devices, where $1 \leq K \leq L$. The control module generates first and second control signals. The first control signals deselect half of the first control devices in each of the P levels. The isolation circuit includes a plurality of isolation devices each having first ends that communicate with the first sub-decoder, and second ends. The first ends selectively communicate with the second ends based on the second control signals.

In other features, an integrated circuit (IC) comprises the bit line decoder and further comprises R memory sub-arrays of the memory array. The R memory sub-arrays include a first memory sub-array. The first memory sub-array includes the first set of S of the B bit lines and communicates with the first sub-decoder via the first set of S of the B bit lines. The R memory sub-arrays include (R−1) memory sub-arrays that include (R−1) sets of S of the B bit lines, respectively, where B=S*R, and R is an integer greater than 1. The first set of S of the B bit lines and the (R−1) sets of S of the B bit lines provide R sets of S of the B bit lines.

In other features, the IC further comprises (R−1) of the first sub-decoders that communicate with the (R−1) memory sub-arrays via the (R−1) sets of S of the B bit lines, respectively. The first sub-decoder and the (R−1) of the first sub-decoders provide R first sub-decoders.

In other features, the IC further comprises (R−1) of the isolation circuits each having first ends that communicate with the (R−1) of the first sub-decoders, respectively, and second ends. The second ends of the isolation circuit communicate with corresponding the second ends of the (R−1) of the isolation circuits. The isolation circuit and the (R−1) of the isolation circuits provide R isolation circuits.

In another feature, the first ends of one of the R isolation circuits communicate with the second ends of one of the R isolation circuits based on the second control signals.

In other features, the IC further comprises a second sub-decoder that includes second control devices arranged in Q of the L levels. The second sub-decoder communicates with the second ends of the R isolation circuits. The second sub-decoder communicates with each of the R first sub-decoders via respective one of the R isolation circuits. The first control signals deselect half of the second control devices in each of the Q levels, and (P+Q)=L.

In other features, the first control devices are greater in number than the second control devices. The first and second sub-decoders are adjacent to the memory array and a sensing circuit, respectively.

In other features, the first control signals select two bit lines from one of the R sets. The two bit lines communicate with one of the memory cells located within one of the R memory sub-arrays that communicates with one of the R first sub-decoders via one of the R sets.

In other features, the IC further comprises a sensing circuit that communicates with the second sub-decoder. The sensing circuit applies a potential difference across the two bit lines, measures current that flows through one of the memory cells, and determines a state of one of the memory cells based on the current.

In other features, the IC further comprises a sensing circuit that applies a first potential to M bit lines from one of the R sets that are on a first side of one of the memory cells. The sensing circuit applies a second potential to N bit lines from one of the R sets that are on a second side of one of the memory cells, where M and N are integers greater than or equal to 1, and (M+N)=S. The sensing circuit measures current that flows through one of the memory cells and determines the state of one of the memory cells based on the current.

In still other features, a method for sensing states of memory cells of a memory array comprises providing control devices and arranging the control devices in a multi-level configuration having a plurality of levels. The method further comprises providing a plurality of the control devices in each of the levels for selectively communicating with bit lines. The method further comprises selecting from the bit lines a first bit line and a second bit line associated with a memory cell located in the memory array when determining a state of the memory cell. The method further comprises generating first control signals that deselect one or more of the control devices at each of the levels. The method further comprises charging a first group of the bit lines including the first bit line to a first potential and charging a second group of the bit lines including the second bit line to a second potential.

In another feature, the method further comprises sensing current that flows through the memory cell and determining the state of the memory cell based on the current.

In other features, the method further comprises providing a first number of the control devices in a first of the levels and providing a second number of the control devices in a second of the levels. The first number is greater than the second number.

In another feature, the method further comprises providing a sensing circuit for sensing the current and locating the first of the levels farther from the sensing circuit than the second of the levels.

In other features, the method further comprises providing a first number of the control devices in a first of the levels and providing a second number of the control devices in a second of the levels. The first number is twice the second number when the first of the levels is adjacent to the second of the levels.

In another feature, the method further comprises deselecting half of the control devices associated with each of the levels based on the first control signals.

In other features, the method further comprises disposing an isolation circuit between a first level and a second level of the levels. The method further comprises generating second control signals and isolating the control devices associated with the first level from the control devices associated with the second level based on the second control signals.

In still other features, a method for sensing states of memory cells of a memory array comprises providing control devices and arranging the control devices in L levels of a bit line decoder, where L is an integer greater than 2. The method further comprises providing $2^K$ of the control devices in a $K^{th}$ of the L levels, where $1 \leq K \leq L$. The method further comprises selectively communicating with B bit lines of the memory array, where $B=(2^L+1)$. The method further comprises generating first control signals, deselecting half of the control devices in each of the L levels based on the first control signals, and selecting two of the B bit lines that communicate with one of the memory cells.

In another feature, the method further comprises applying a potential difference across the two of the B bit lines, sensing current that flows through one of the memory cells, and determining a state of one of the memory cells based on the current.

In other features, the method further comprises applying a first potential to M of the B bit lines that are on a first side of one of the memory cells using a sensing circuit. The method further comprises applying a second potential to N of the B bit lines that are on a second side of one of the memory cells using the sensing circuit, where M and N are integers greater than or equal to 1, and (M+N)=B. The method further comprises sensing current that flows through one of the memory cells using the sensing circuit and determining a state of one of the memory cells based on the current using the sensing circuit.

In another feature, the method further comprises providing a greater number of the control devices in a first of the L levels than in a second of the L levels and arranging the first of the L levels farther from the sensing circuit than the second of the L levels.

In another feature, the method further comprises arranging P of the L levels in a first sub-decoder that is adjacent to the memory array and arranging Q of the L levels in a second sub-decoder that is adjacent to the sensing circuit, where P and Q are integers greater than or equal to 1, and (P+Q)=L.

In another feature, the method further comprises providing an isolation circuit that includes a plurality of isolation devices each having first and second ends, communicating with the first ends and the first sub-decoder, and communicating with the second ends and the second sub-decoder.

In another feature, the method further comprises generating second control signals that control the isolation devices and isolating the first sub-decoder from the second sub-decoder based on the second control signals.

In another feature, the method further comprises determining a state of one of the memory cells when the isolation devices do not isolate the first sub-decoder from the second sub-decoder.

In another feature, the method further comprises integrating the bit line decoder and the memory array in an integrated circuit (IC).

In still other features, a method for sensing states of memory cells of a memory array comprises providing a first sub-decoder that includes first control devices arranged in P of L levels of a bit line decoder, where P and L are integers greater than 2, and P<L. The method further comprises providing $2^K$ control devices in a $K^{th}$ of the L levels, where $1 \leq K \leq L$. The method further comprises selectively communicating with a first set of S of B bit lines of the memory array via the first control devices, and where $S=(2^L+1)$, and S<B. The method further comprises generating first and second control signals and deselecting half of the first control devices in each of the P levels based on the first control signals. The method further comprises providing an isolation circuit that includes a plurality of isolation devices each having first ends and second ends. The method further comprises communicating with the first ends and the first sub-decoder and selectively communicating with the first ends and the second ends based on the second control signals.

In other features, the method further comprises providing a first memory sub-array including the first set of S of the B bit lines. The method further comprises communicating with the first memory sub-array and the first sub-decoder via the first set of S of the B bit lines. The method further comprises providing (R−1) memory sub-arrays that include (R−1) sets of S of the B bit lines, respectively, where B=S*R, and R is an integer greater than 1. The first set of S of the B bit lines and the (R−1) sets of S of the B bit lines provide R sets of S of the B bit lines.

In other features, the method further comprises providing (R−1) of the first sub-decoders. The method further comprises communicating with the (R−1) memory sub-arrays and the (R−1) of the first sub-decoders via the (R−1) sets of S of the B bit lines, respectively. The first sub-decoder and the (R−1) of the first sub-decoders provide R first sub-decoders.

In other features, the method further comprises providing (R−1) of the isolation circuits each having first ends and second ends. The method further comprises communicating with the first ends of the (R−1) of the isolation circuits and the (R−1) of the first sub-decoders, respectively. The method further comprises communicating with the second ends of the isolation circuit and corresponding the second ends of the (R−1) of the isolation circuits. The isolation circuit and the (R−1) of the isolation circuits provide R isolation circuits.

In another feature, the method further comprises communicating with the first ends of one of the R isolation circuits and the second ends of one of the R isolation circuits based on the second control signals.

In other features, the method further comprises providing a second sub-decoder that includes second control devices arranged in Q of the L levels, where (P+Q)=L. The method further comprises communicating with the second sub-decoder and the second ends of the R isolation circuits. The method further comprises deselecting half of the second control devices in each of the Q levels based on the first control signals. The method further comprises communicating with the second sub-decoder and each of the R first sub-decoders via respective one of the R isolation circuits.

In another feature, the method further comprises providing the first control devices that are greater in number than the second control devices and arranging the first and second sub-decoders adjacent to the memory array and a sensing circuit, respectively.

In other features, the method further comprises selecting two bit lines from one of the R sets based on the first control signals and communicating with one of the memory cells via the two bit lines. The memory cell is located within one of the R memory sub-arrays that communicates with one of the R first sub-decoders via one of the R sets.

In other features, the method further comprises providing a sensing circuit and communicating with the sensing circuit and the second sub-decoder. The method further comprises applying a potential difference across the two bit lines using the sensing circuit, measuring current that flows through one of the memory cells using the sensing circuit, and determining a state of one of the memory cells based on the current using the sensing circuit.

In other features, the method further comprises providing a sensing circuit, applying a first potential to M bit lines from one of the R sets that are on a first side of one of the memory cells using the sensing circuit, and applying a second potential to N bit lines from one of the R sets that are on a second side of one of the memory cells using the sensing circuit, where M and N are integers greater than or equal to 1, and (M+N)=S. The method further comprises measuring current that flows through one of the memory cells using the sensing circuit and determining the state of one of the memory cells based on the current using the sensing circuit.

In still other features, a bit line decoder for sensing states of memory cells of a memory array comprises control means for selectively communicating with bit lines. The control means are arranged in a multi-level configuration having a plurality of levels, each level having a plurality of the control means. The bit line decoder further comprises selecting means for selecting from the bit lines a first bit line and a second bit line associated with a memory cell located in the memory array when determining a state of the memory cell and for generating first control signals that deselect one or more of the control devices at each level. When one or more control means at each level are deselected, a first group of the bit lines including the first bit line is charged to a first potential and a second group of the bit lines including the second bit line is charged to a second potential.

In another feature, the bit line decoder further comprises sensing means for applying the first potential to the first group of the bit lines and the second potential to the second group of the bit lines, for sensing current that flows through the memory cell, and for determining the state of the memory cell based on the current.

In another feature, a first number of the control means associated with a first of the levels is greater than a second number of the control means associated with a second of the levels.

In another feature, the first of the levels is located farther from the sensing circuit than the second of the levels.

In another feature, when a first of the levels is adjacent to a second of the levels, a first number of the control means associated with the first of the levels is twice a second number of the control means associated with the second of the levels.

In another feature, the first control signals deselect half of the control means associated with each level.

In other features, the bit line decoder further comprises isolating means for selectively isolating a first level and a second level of the levels. The isolation means is disposed between the first and second levels.

In other features, the selecting means generates second control signals that control the isolating means. The isolating means isolates the control means associated with the first level from the control means associated with the second level based on the second control signals.

In another feature, an integrated circuit (IC) comprises the bit line decoder and further comprises the memory array.

In still other features, a bit line decoder for sensing states of memory cells of a memory array comprises control means for selectively communicating with B bit lines of the memory array. The control means are arranged in L levels of the bit line decoder, and a $K^{th}$ of the L levels includes $2^K$ of the control means, where L is an integer greater than 2, $1 \leq K \leq L$, and $B=(2^L+1)$. The bit line decoder further comprises selecting means for generating first control signals that deselect half of the control means in each of the L levels and that select two of the B bit lines that communicate with one of the memory cells.

In another feature, the bit line decoder further comprises sensing means for applying a potential difference across the two of the B bit lines, for sensing current that flows through one of the memory cells, and for determining a state of one of the memory cells based on the current.

In other features, the bit line decoder further comprises sensing means for applying a first potential to M of the B bit lines that are on a first side of one of the memory cells, and for applying a second potential to N of the B bit lines that are on a second side of one of the memory cells, where M and N are integers greater than or equal to 1, and (M+N)=B. The sensing means senses current that flows through one of the memory cells and determines a state of one of the memory cells based on the current.

In other features, a first of the L levels includes a greater number of the control means than a second of the L levels. The first of the L levels is located farther from the sensing means than the second of the L levels.

In another feature, P of the L levels are arranged in first sub-decoder means for sensing the states that is adjacent to the memory array, and Q of the L levels are arranged in second sub-decoder means for sensing the states that is adjacent to the sensing means, where P and Q are integers greater than or equal to 1, and (P+Q)=L.

In other features, the bit line decoder further comprises isolating means for isolating the first sub-decoder means from the second sub-decoder means. Each of the isolating means has first ends that communicate with the first sub-decoder means and second ends that communicate with the second sub-decoder means.

In other features, the selecting means generates second control signals that control the isolating means. The isolating means isolate the first sub-decoder means from the second sub-decoder means based on the second control signals.

In another feature, the sensing means determines a state of one of the memory cells when the isolating means do not isolate the first sub-decoder means from the second sub-decoder means.

In another feature, an integrated circuit (IC) comprises the bit line decoder and further comprises the memory array.

In still other features, a bit line decoder for sensing states of memory cells of a memory array comprises first sub-decoder means for sensing the states. The first sub-decoder means includes first control means for selectively communicating with a first set of S of B bit lines of the memory array. The first control means are arranged in P of L levels of the bit line decoder, and a $K^{th}$ of the L levels includes $2^K$ control means, where L is an integer greater than 2, P<L, $1 \leq K \leq L$, $S=(2^L+1)$, and S<B. The bit line decoder further comprises selecting means for generating first and second control signals. The first control signals deselect half of the first control means in each of the P levels. The bit line decoder further comprises an isolation circuit that includes isolating means for isolating the first sub-decoder. Each of the isolating means has first ends that communicate with the first sub-decoder, and second ends. The first ends selectively communicate with the second ends based on the second control signals.

In other features, an integrated circuit (IC) comprises the bit line decoder and further comprises R memory sub-arrays of the memory array. The R memory sub-arrays include a first memory sub-array. The first memory sub-array includes the first set of S of the B bit lines. The first memory sub-array communicates with the first sub-decoder means via the first set of S of the B bit lines. The IC further comprises (R−1) memory sub-arrays that include (R−1) sets of S of the B bit lines, respectively, where B=S*R, and R is an integer greater than 1. The first set of S of the B bit lines and the (R−1) sets of S of the B bit lines provide R sets of S of the B bit lines.

In other features, the IC further comprises (R−1) of the first sub-decoder means for sensing the states. The (R−1) of the first sub-decoder means communicate with the (R−1) memory sub-arrays via the (R−1) sets of S of the B bit lines, respectively. The first sub-decoder means and the (R−1) of the first sub-decoder means provide R first sub-decoder means.

In other features, the IC further comprises (R−1) of the isolation circuits each having first ends that communicate with the (R−1) of the first sub-decoder means, respectively, and second ends. The second ends of the isolation circuit communicate with corresponding the second ends of the (R−1) of the isolation circuits. The isolation circuit and the (R−1) of the isolation circuits provide R isolation circuits.

In another feature, the first ends of one of the R isolation circuits communicate with the second ends of one of the R isolation circuits based on the second control signals.

In other features, the IC further comprises second sub-decoder means for sensing the states. The second sub-decoder means includes second control means for communicating with the second ends of the R isolation circuits and for communicating with each of the R first sub-decoder means via respective one of the R isolation circuits. The second control means are arranged in Q of the L levels, (P+Q)=L. The first control signals deselect half of the second control means in each of the Q levels.

In other features, the first control means are greater in number than the second control means. The first and second sub-decoders are adjacent to the memory array and a sensing circuit, respectively.

In other features, the first control signals select two bit lines from one of the R sets. The two bit lines communicate with one of the memory cells located within one of the R memory sub-arrays that communicates with one of the R first sub-decoder means via one of the R sets.

In another feature, the IC further comprises sensing means for communicating with the second sub-decoder means, for applying a potential difference across the two bit lines, for measuring current that flows through one of the memory cells, and for determining a state of one of the memory cells based on the current.

In other features, the IC further comprises sensing means for applying a first potential to M bit lines from one of the R sets that are on a first side of one of the memory cells and a second potential to N bit lines from one of the R sets that are on a second side of one of the memory cells, where M and N are integers greater than or equal to 1, and (M+N)=S. The sensing means measures current that flows through one of the memory cells and determines the state of one of the memory cells based on the current.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5C is a truth table for the exemplary bit line decoder of FIG. 5B;

FIG. 6B is a truth table for the exemplary bit line decoder of FIG. 6A;

DETAILED DESCRIPTION

Figure 1:
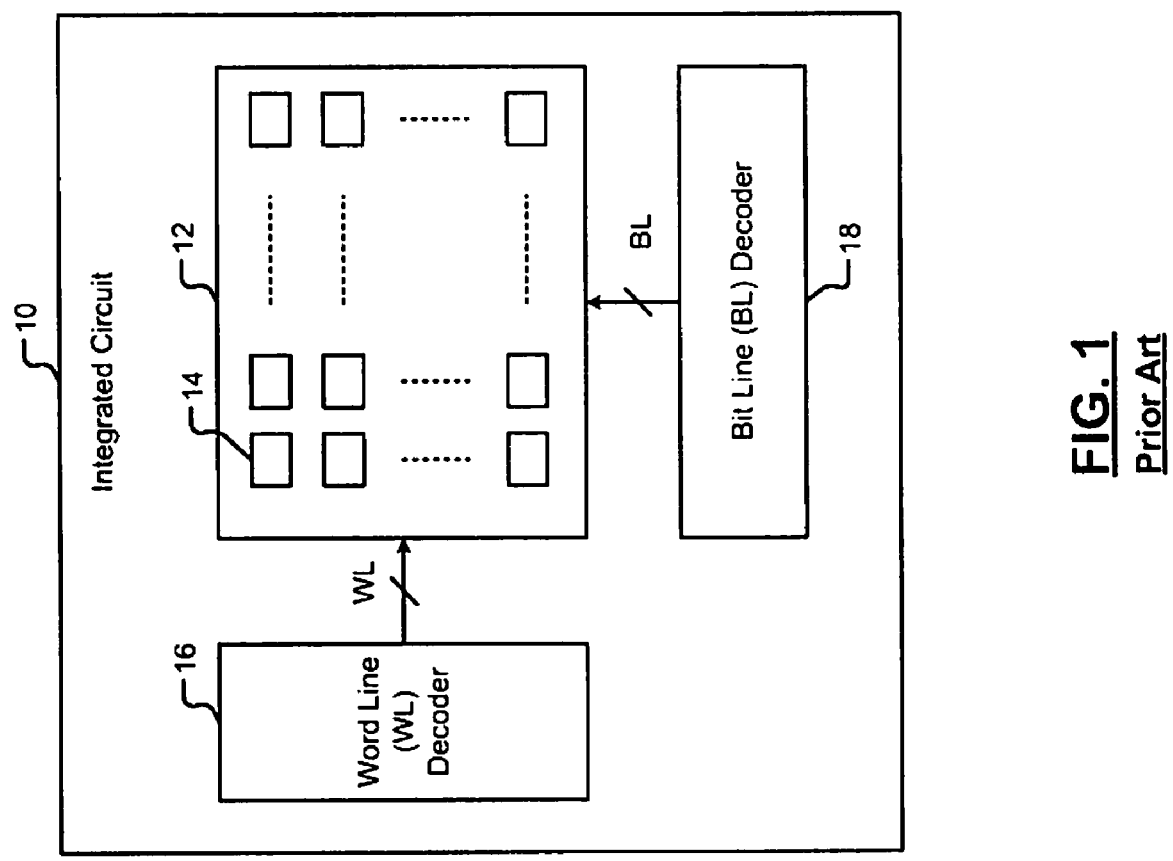
FIG. 1 is a functional block diagram of an integrated circuit (IC) comprising a memory array according to the prior art.
Figure 2:
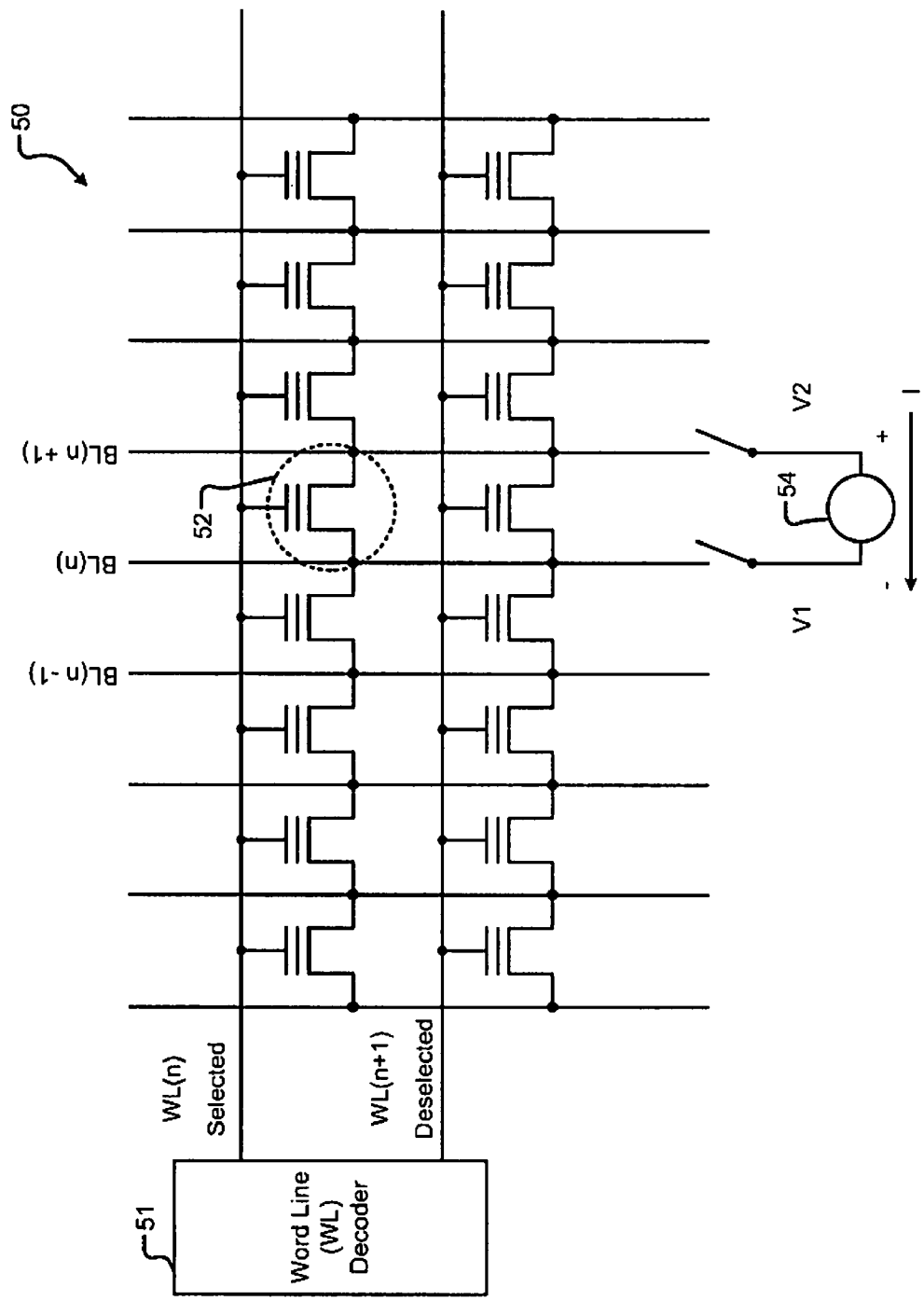
FIG. 2 is a schematic of an exemplary NOR-type memory array according to the prior art.
Figure 3:
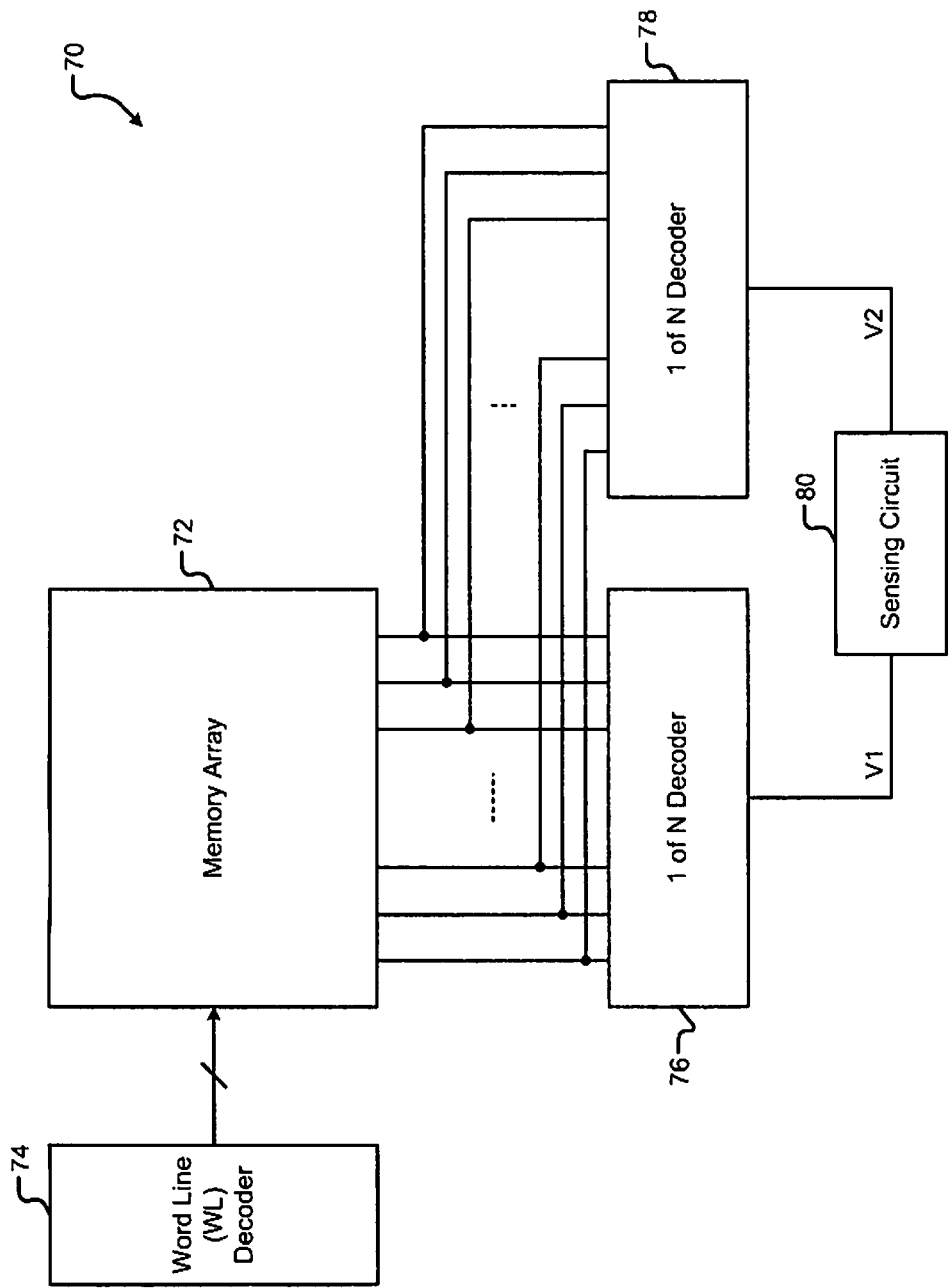
FIG. 3 is a functional block diagram of an IC comprising a memory array, decoders, and a state sensing circuit according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Memory arrays having high storage capacities comprise a large number of memory cells and bit lines. Decoders having a tree structure (i.e., a hierarchical structure) are used to select pairs of adjacent bit lines from the large number of bit lines. The decoders select signal paths using a series of selected devices (i.e., devices that are turned on). Decoders having large tree structures, however, can be problematic for several reasons.

For example, decoders having large tree structures increase power consumption and occupy a large area of the memory integrated circuits (ICs). Additionally, when the decoders are used to measure the state of a memory cell, all bit lines other than the adjacent bit lines that connect to the memory cell are in a floating state. Furthermore, states of memory cells that are adjacent to the memory cell under measurement are unknown. Consequently, charging times to charge the adjacent bit lines to the potentials V1 and V2 are unknown. Until the adjacent bit lines are fully charged to the potentials V1 and V2, the current measured by the sensing circuit 80 is not the current that flows through the memory cell under measurement and is not representative of the state of the memory cell. Accordingly, the state of the memory cell can not be measured precisely.

Figure 4:
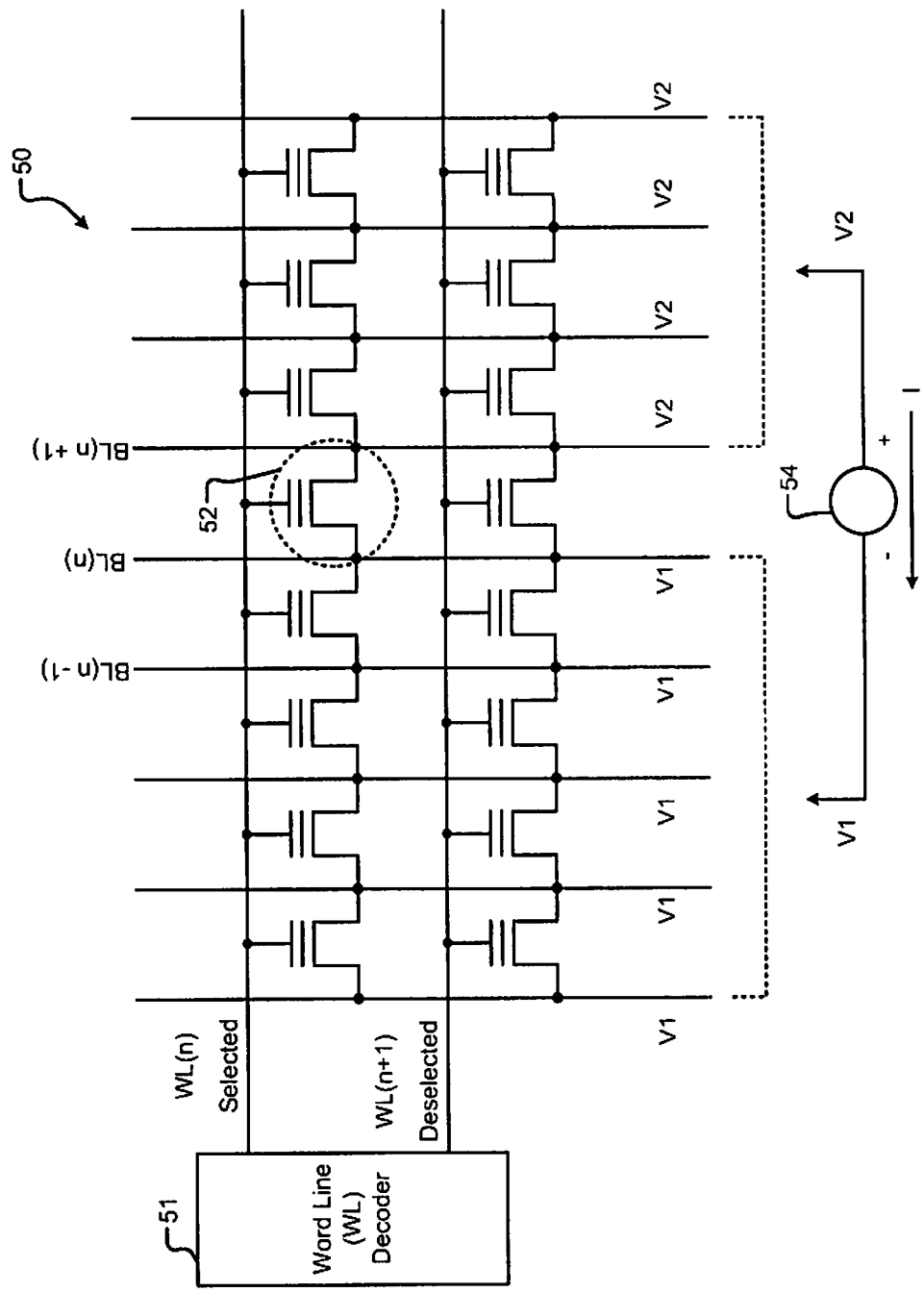
FIG. 4 is a schematic of an exemplary NOR-type memory array.

Referring now to FIG. 4, the present disclosure teaches presetting the states of all the bit lines by charging the bit lines on either side of the memory cell under measurement to predetermined potentials. For example, when the state of the $n^{th}$ memory cell 52 is measured, all the bit lines on a first side of the $n^{th}$ memory cell 52 (i.e., BL(n), BL(n−1), etc.) can be charged to the potential V1. Additionally, all the bit lines on a second side of the $n^{th}$ memory cell 52 (i.e., BL(n+1), BL(n+2), etc.) can be charged to the potential V2. When the state of the $n^{th}$ memory cell 52 is measured in this manner, states of memory cells other than the $n^{th}$ memory cell 52 are irrelevant (i.e., "don't care").

More specifically, the present disclosure relates to a compact bit line decoder that utilizes a divisible tree structure having multiple levels. The bit line decoder comprises control devices (e.g., transistors) arranged in the multiple levels of the tree structure. The bit line decoder senses states of memory cells of memory arrays by deselecting (i.e., turning off) a predetermined number of control devices in one or more levels of the tree structure. The control devices block signal paths when deselected. When a memory cell is selected by deselecting the predetermined number of control devices, the bit line decoder presets the states of all bit lines by charging the bit lines to predetermined potentials V1 and V2 and measures the state of the memory cell.

Additionally, when memory arrays are large, the tree structure of the bit line decoder can be divided into sections. The bit line decoder can be divided into a plurality of sub-decoders by adding isolation devices between the sections. The memory arrays can be divided into memory sub-arrays, and the sub-decoders can be integrated into the memory sub-arrays.

Figure 5A:
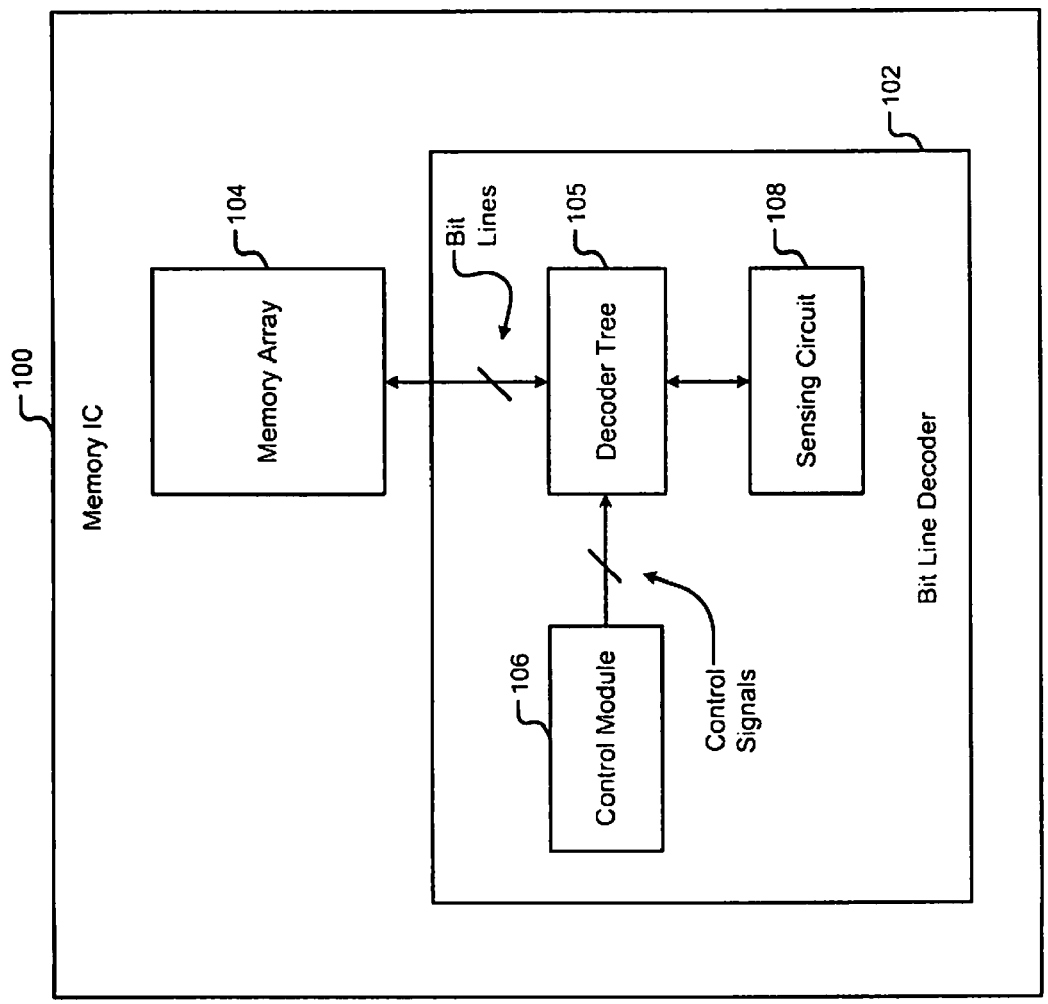
FIG. 5A is a functional block diagram of an IC comprising a memory array, a bit line decoder decoders, and a state sensing circuit according to the present disclosure.
Figure 5B:
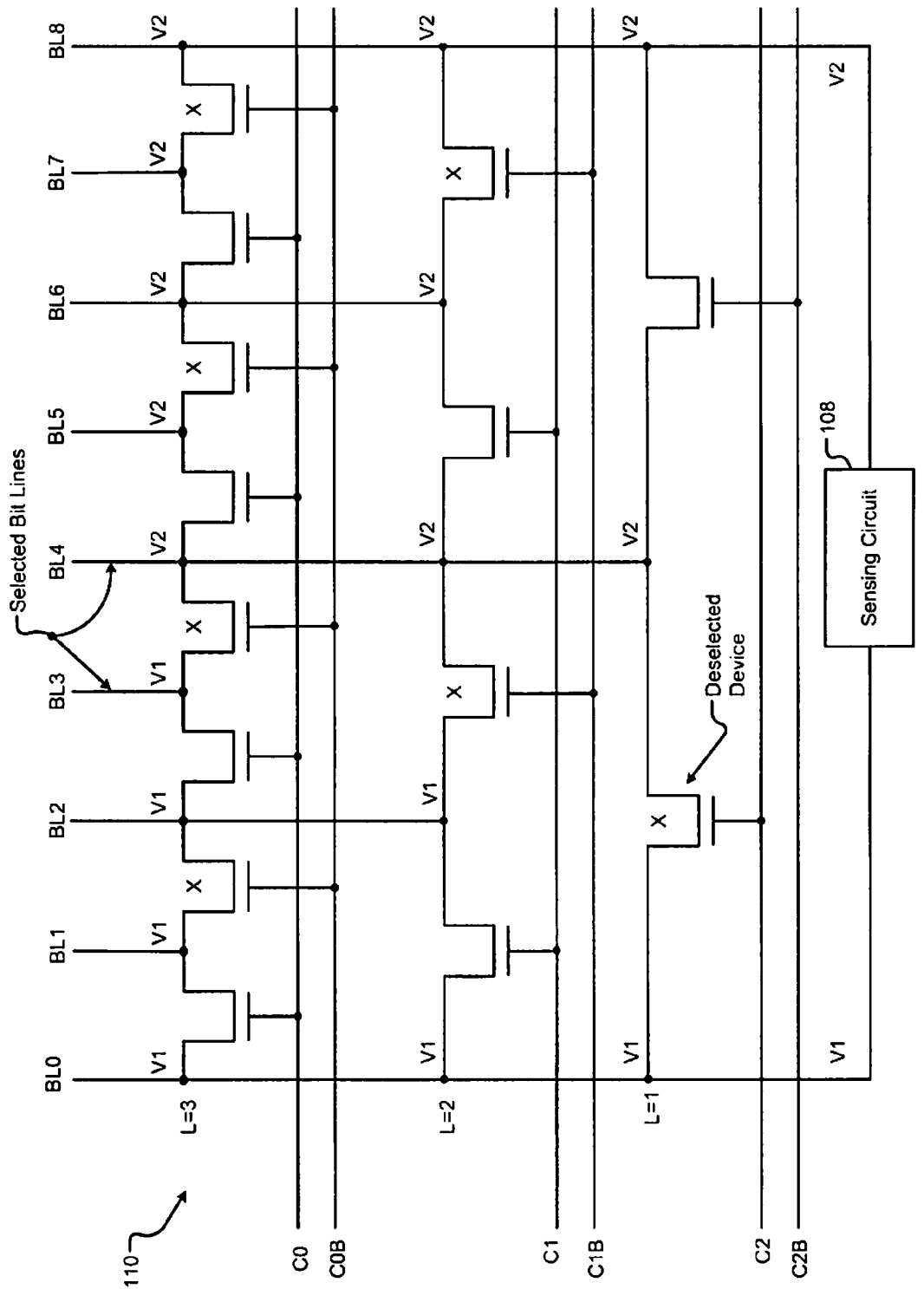
FIG. 5B is a schematic of an exemplary bit line decoder according to the present disclosure.

Referring now to FIGS. 5A-5C, an IC 100 comprising an exemplary bit line decoder 102 according to the present disclosure is shown. In FIG. 5A, the IC 100 comprises the bit line decoder 102 and a NOR-type memory array 104. The bit line decoder 102 comprises a decoder tree structure 105, a control module 106, and a sensing circuit 108. The decoder tree structure 105 comprises a plurality of levels of control devices (not shown).

The control module 106 generates control signals that deselect a predetermined number of control devices in each level of the decoder tree structure 105. The predetermined number depends on the decoder tree structure (e.g., number of levels in the decoder tree structure). The control signals may include address lines used to address the memory cells of the NOR-type memory array 104. The bit line decoder 102 senses states of the memory cells of the NOR-type memory array 104 based on the control signals as follows.

In FIG. 5B, as an example, the decoder tree structure 105 is shown to comprise a binary tree structure 110. The binary tree structure 110 may have L levels when the bit line decoder 102 measures states of $2^L$ memory cells of the NOR-type memory array 104, where L is an integer greater than or equal to 1. A level L includes $2^L$ control devices. The control devices may include transistors. A level adjacent or closest to the NOR-type memory array 104 is called a lowest level of the binary tree structure 110. A level farthest from the NOR-type memory array 104 is called a highest level of the binary tree structure 110. The lowest level includes the most number of control devices. The highest level includes the least number of control devices.

As an example, the NOR-type memory array 104 is shown to comprise a group of 8 memory cells (not shown) and 8 bit lines for simplicity. Since $2^L=8$ gives L=3, the bit line decoder 102 that measures states of the 8 memory cells of the NOR-type memory array 104 has a 3-level decoder tree structure. Accordingly, the bit line decoder 102 may be called a 3-level decoder. The lowest level (L=3) includes $2^3=8$ control devices. The 8 control devices are organized into 4 groups. Each of the 4 groups comprises 2 control devices. The highest level (L=1) includes $2^1=2$ control devices.

In use, the control module 106 generates control signals that deselect or turn off one of every two control devices at each level of the binary tree structure 110. The control signals may include address lines used to address memory cells of the NOR-type memory array 104. The deselected control devices are marked "X" in FIG. 5B. Based on the control signals and the control devices deselected by the control signals, a memory cell connected to a pair of adjacent bit lines is selected for measurement. A truth table for the binary tree structure 110 is shown in FIG. 5C.

As shown in the truth table, when the control signals are C2=C1=C0=0, based on the control devices deselected by the control signals, the memory cell connected to bit lines BL0 and BL1 is selected. The state of the selected memory cell is measured by applying voltage V1 to bit line BL0 and voltage V2 to the bit lines BL1-Bl7. When the control signals are C2=C1=0 and C0=1, based on the control devices deselected by the control signals, the memory cell connected to bit lines BL1 and BL2 is selected. The state of the selected memory cell is measured by applying voltage V1 to bit lines BL0-BL1 and voltage V2 to the bit lines BL2-Bl7. When the control signals are C2=C0=0 and C1=1, based on the control devices deselected by the control signals, the memory cell connected to bit lines BL2 and BL3 is selected. The state of the selected memory cell is measured by applying voltage V1 to bit lines BL0-BL2 and voltage V2 to the bit lines BL3-Bl7, and so on.

In the example shown in FIG. 5B, based on the deselected devices, a memory cell connected to the bit lines BL3 and BL4 is selected for measurement. Although the truth table shown uses the control signals C0-C2, control signals C0B-C2B, which are inverted control signals C0-C2, may be alternatively used. The bit line decoder 102 measures the state of the memory cell as follows.

A sensing circuit 108 applies the potential V1 to the bit lines BL3-BL0 and the potential V2 to the bit lines BL4-BL8. The sensing circuit 108 measures the current that flows through the memory cell and measures the state of the memory cell based on the current. For example, the current may have a first value when the memory cell is in a first state and a second value when the memory cell is in a second state. The first state and the first value may be different than the second state and the second value, respectively.

Figure 6A:
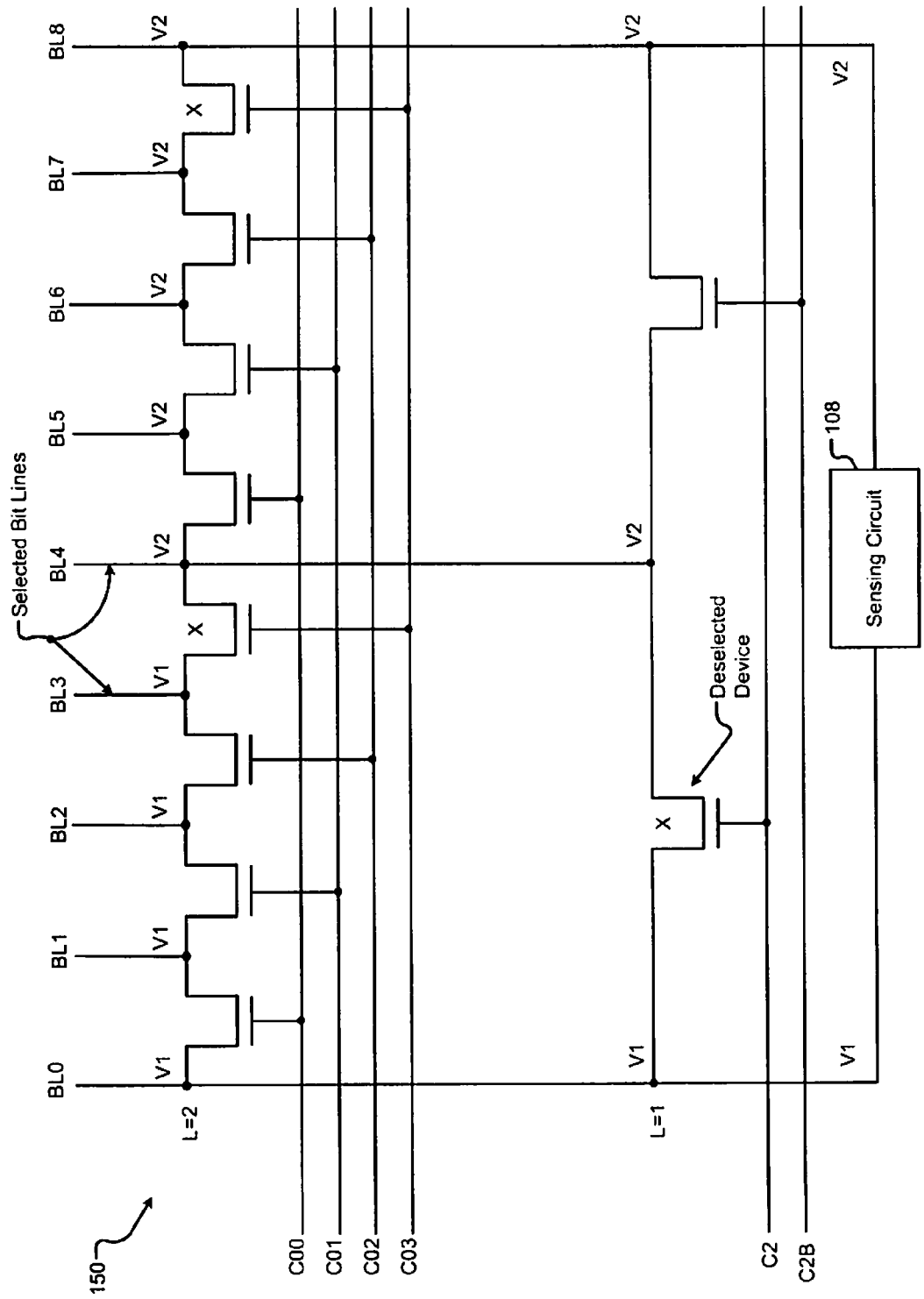
FIG. 6A is a schematic of an exemplary decoder tree structure of a bit line decoder according to the present disclosure.

Referring now to FIGS. 6A and 6B, bit line decoders may have tree structures that are different than binary tree structures. In FIG. 6A, as an example, the decoder tree structure 150 may comprise a 2-level decoder tree structure 150 that is used to measure states of the 8 memory cells of the NOR-type memory array 104. A lower level (L=2) of the decoder tree structure 150 that connects to the NOR-type memory array 104 comprises 8 control devices. The 8 control devices are organized into 2 groups. Each of the 2 groups comprises 4 control devices. An upper level (L=1) comprises 2 control devices.

In general, the lower level (L=2) of the decoder tree structure 150 may comprise D control devices, where $\log_2 D$ is an integer greater than 2, and the D control devices communicate with (D+1) bit lines. The D control devices may be organized in two groups, and one control device in each group may be deselected.

In use, the control module 106 generates control signals that deselect one of every four control devices in the lower level of the decoder tree structure 150. The deselected control devices are marked "X" in FIG. 6A. Based on the control signals and the control devices deselected by the control signals, a memory cell connected to a pair of adjacent bit lines is selected for measurement. A truth table for the 2-level decoder tree structure 150 is shown in FIG. 6B.

As shown in the truth table, when the control signals are C2=0, C03=C02=C01=1, and C00=0, based on the control devices deselected by the control signals, the memory cell connected to bit lines BL0 and BL1 is selected. The state of the selected memory cell is measured by applying voltage V1 to bit line BL0 and voltage V2 to the bit lines BL1-Bl8. When the control signals are C2=0, C03=C02=C00=1, and C01=0, based on the control devices deselected by the control signals, the memory cell connected to bit lines BL1 and BL2 is selected. The state of the selected memory cell is measured by applying voltage V1 to bit lines BL0-BL1 and voltage V2 to the bit lines BL2-Bl8. When the control signals are C2=0, C03=C01=C00=1, and C02=0, based on the control devices deselected by the control signals, the memory cell connected to bit lines BL2 and BL3 is selected. The state of the selected memory cell is measured by applying voltage V1 to bit lines BL0-BL2 and voltage V2 to the bit lines BL3-Bl8, etc.

In the example shown in FIG. 6A, based on the deselected devices, a memory cell connected to the bit lines BL3 and BL4 is selected for measurement. The sensing circuit 108 applies the potential V1 to the bit lines BL3-BL0 and the potential V2 to the bit lines BL4-BL8. The sensing circuit 108 measures the current that flows through the memory cell and measures the state of the memory cell based on the current.

When the storage capacity of NOR-type memory arrays is large, the number of bit lines can be very large (e.g., 128 bit lines per bit line group). When the sensing circuit 108 charges a large number of bit lines to the predetermined potentials, the capacitances of the bit lines add up to a net capacitance. The value of the net capacitance can be very high. The high value of the net capacitance decreases the sensing speed of the sensing circuit 108.

The value of the net capacitance can be decreased and the sensing speed can be increased by segmenting the NOR-type memory arrays into a plurality of memory sub-arrays. Additionally, bit line decoders may be divided into a plurality of sub-decoders at any level of the decoder tree structure. Isolation devices may be provided between the sub-decoders of adjacent levels. Each of the memory sub-arrays communicates with a sub-decoder comprising one or more lower tree-levels of the decoder tree structure. When the state of a memory cell of a memory sub-array is measured, only the memory sub-array that includes the memory cell under measurement is connected to the sensing circuit.

Figure 7A:
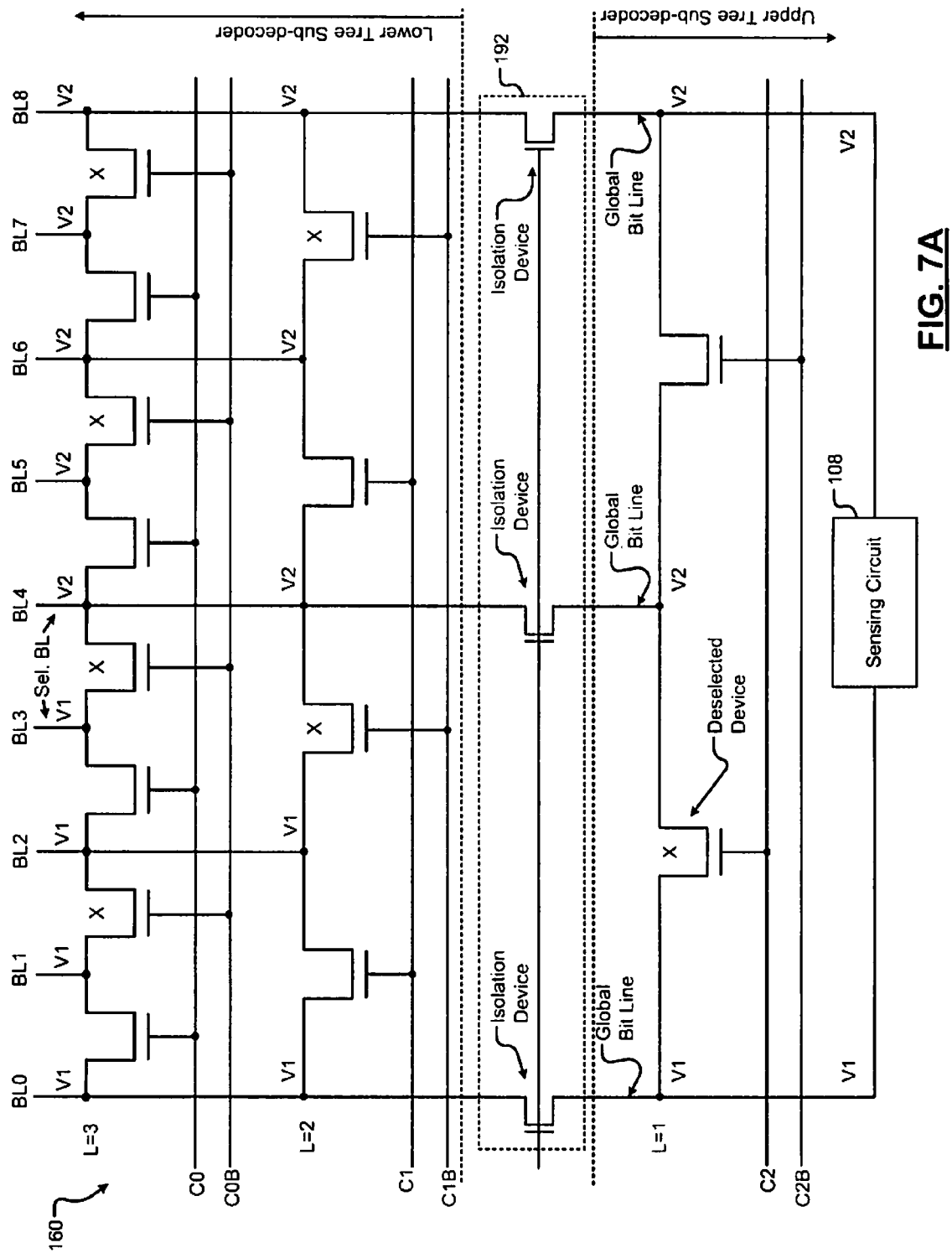
FIG. 7A is a schematic of an exemplary decoder tree structure of a bit line decoder according to the present disclosure.
Figure 7B:
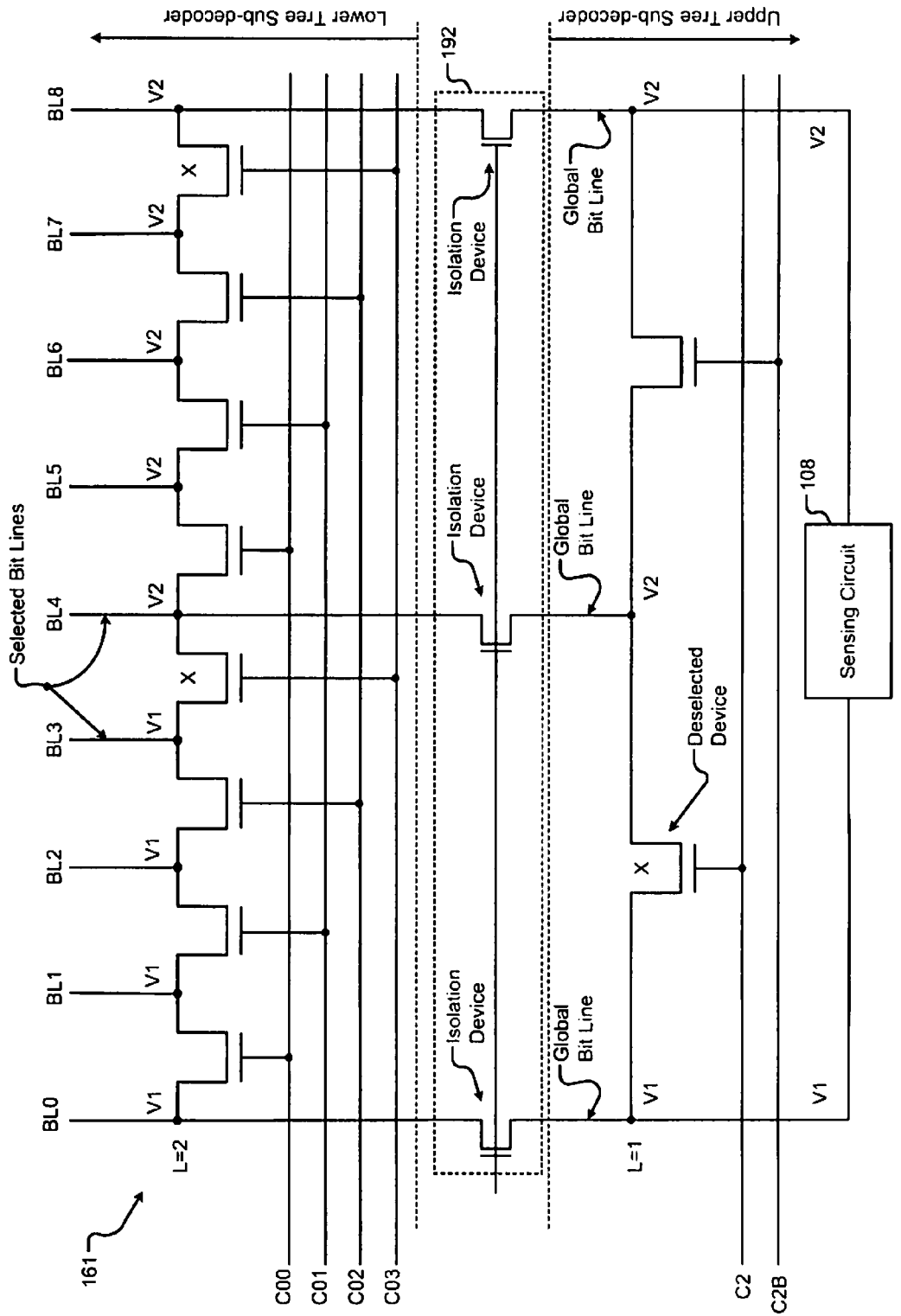
FIG. 7B is a schematic of an exemplary decoder tree structure of a bit line decoder according to the present disclosure.

Referring now to FIGS. 7A and 7B, exemplary decoder tree structures 160 and 161 that are divided into two sub-decoders are shown, respectively. The two sub-decoders are called a lower-tree sub-decoder and an upper-tree sub-decoder. An isolation circuit 192 comprising isolating devices (e.g., transistors) separates (i.e., isolates) the lower-tree sub-decoder from the upper-tree sub-decoder as shown.

The control module 106 generates control signals that are input to the isolating devices. Based on the control signals, the isolation circuit 192 isolates the lower-tree sub-decoder from the upper-tree sub-decoder. When the lower-tree sub-decoder is isolated from the upper-tree sub-decoder, the sensing circuit 108 cannot sense the state of any memory cell of a memory sub-array that communicates with the lower-tree sub-decoder. On the other hand, based on the control signals, when the isolation circuit 192 does not isolate the lower-tree sub-decoder from the upper-tree sub-decoder, the sensing circuit 108 measures the state of a memory cell of the memory sub-array that communicates with the lower-tree sub-decoder.

In some implementations, the lower-tree sub-decoder and/or the upper-tree sub-decoder of the decoder tree structure 160 may comprise a plurality of levels of the decoder tree structure 160. Alternatively, the lower-tree sub-decoder and the upper-tree sub-decoder of the decoder tree structure 161 may comprise the lower level (L=2) and the upper level (L=1) of the decoder tree structure 161, respectively.

Figure 8:
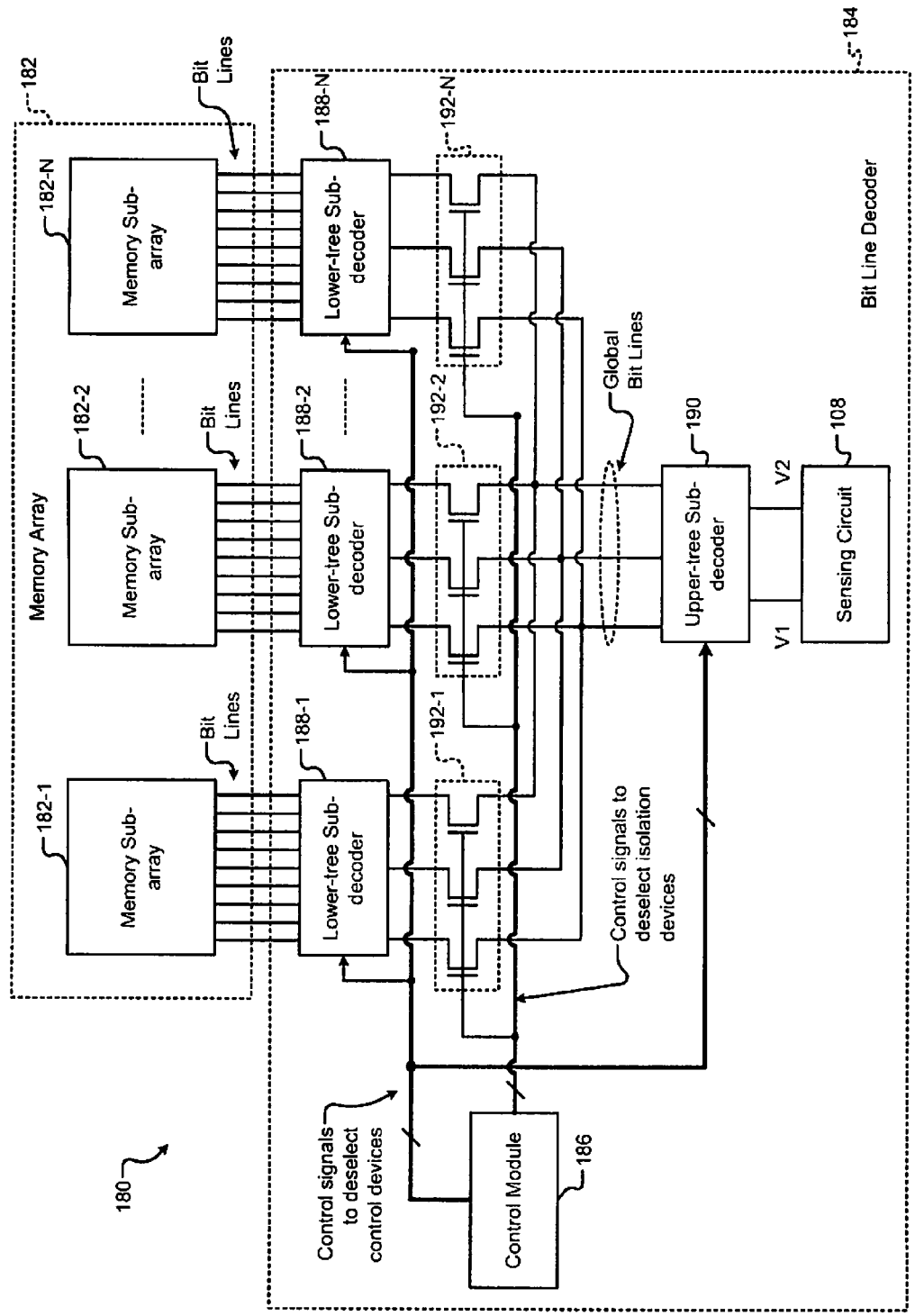
FIG. 8 is a functional block diagram of an exemplary IC comprising a bit line decoder according to the present disclosure.

Referring now to FIG. 8, an IC 180 comprising a memory array 182 and a bit line decoder 184 is shown. The memory array 182 is segmented into a plurality of memory sub-arrays 182-1, 182-2, . . . , and 182-N (collectively memory sub-arrays 182), where N is an integer greater than 1. The bit line decoder 184 comprises a control module 186, the sensing circuit 108, the isolation circuits 192, and a divided decoder tree structure.

Specifically, the divided decoder tree structure of the bit line decoder 184 is divided into an upper-tree sub-decoder 190 and a plurality of lower-tree sub-decoders 188-1 188-2, . . . , and 188-N (collectively lower-tree sub-decoders 188). The lower-tree sub-decoders 188 are separated (i.e., isolated) from the upper-tree sub-decoder 190 by isolation circuits 192-1, 192-2, . . . , and 192-N (collectively isolation circuits 192), respectively.

Each isolation circuit 192 may include a plurality of isolation devices (e.g., transistors). The outputs of the isolation devices of one isolation circuit 192 are connected to the corresponding outputs of the isolation devices of the other isolation circuits 192 to form global bit lines as shown. The global bit lines connect to the upper-tree sub-decoder 190.

The sensing circuit 108 uses the global bit lines to communicate with the memory sub-arrays 182. The sensing circuit 108 communicates with one of the memory sub-arrays 182 at a time. The sensing circuit 108 does not communicate with more than one of the memory sub-arrays 182 at a time.

In use, the control module 186 generates first control signals that deselect a predetermined number of control devices at each tree-level of the lower-tree sub-decoders 188 and the upper-tree sub-decoder 190. The predetermined number is based on the tree structure of the bit line decoder 184 and the number of levels in the decoder tree structure. Based on the first control signals and the deselected control devices, a memory cell of one of the memory sub-arrays 182 is selected for measurement. For example, the memory cell under measurement may be located in the memory sub-array 182-$k$, where $1 \leq k \leq N$. The first control signals may include the address lines used to address the memory cells in the NOR-type memory array 182.

Additionally, the control module 186 generates second control signals that control the isolation circuits 192. Specifically, when the memory cell under measurement is located in the memory sub-array 182-$k$, the second control signals select the isolation circuit 192-$k$. Accordingly, when the sensing circuit 108 measures the state of the memory cell of the memory sub-array 182-$k$, only the bit lines of the memory sub-array 182-$k$ are charged to the predetermined potentials V1 and V2. The sensing circuit 108 communicates with the memory sub-array 182-$k$ via the global bit lines and the selected isolation circuit 192-$k$.

Specifically, the sensing circuit 108 applies the potential difference (V2−V1) across the adjacent bit lines that connect to the memory cell under measurement in the memory sub-array 182-$k$. Additionally, in the memory sub-array 182-$k$, all the bit lines on the first side of the memory cell are charged to the potential V1, and all the bit lines on the second side of the memory cell are charged to the potential V2. The sensing circuit 108 measures the current that flows through the memory cell and determines the state of the memory cell.

Figure 9:
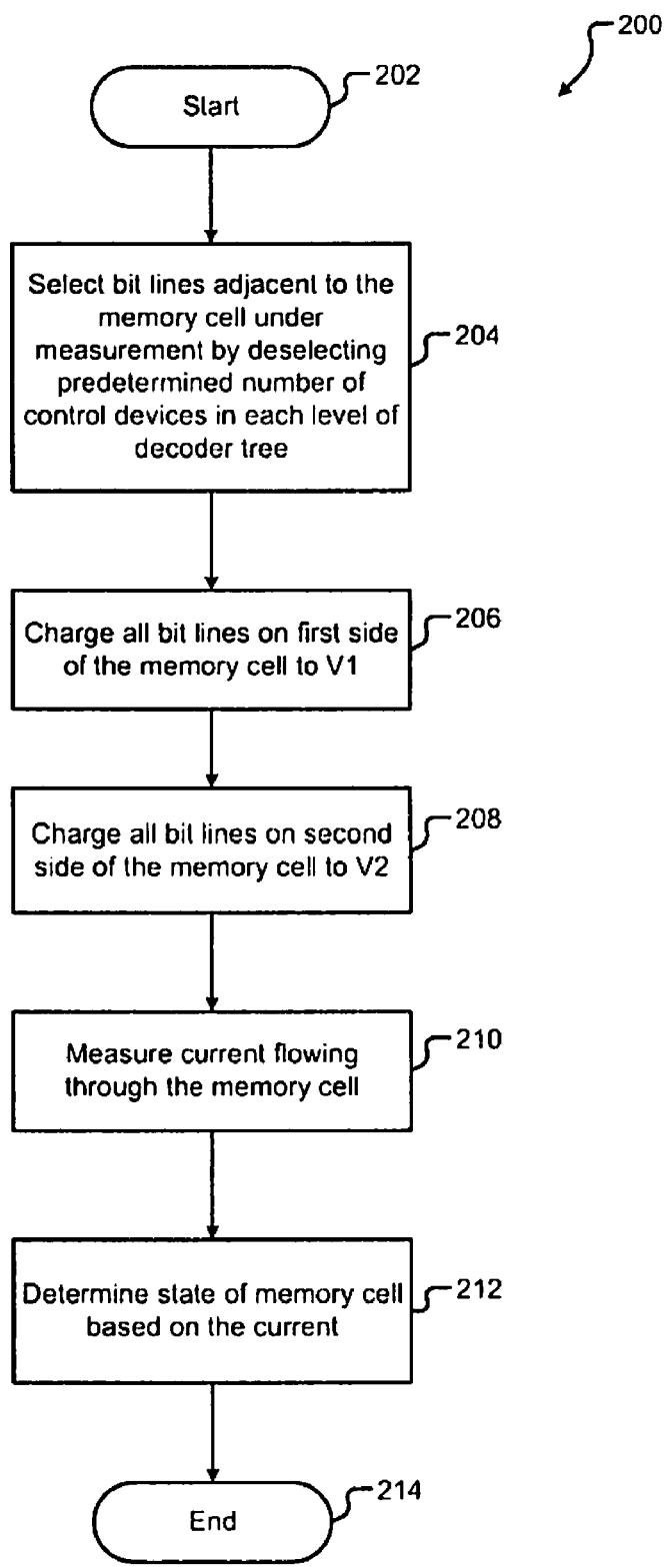
FIG. 9 is a flowchart of an exemplary method for sensing states of memory cells of memory arrays using a bit line decoder according to the present disclosure.

Referring now to FIG. 9, a method 200 for measuring the state of the memory cell of the NOR-type memory array 104 using the bit line decoder 102 begins at step 202. The control module 106 selects bit lines adjacent to the memory cell under measurement by deselecting a predetermined number of control devices in each level of the bit line decoder 102 in step 204. The sensing circuit 108 charges all the bit lines on the first side of the memory cell to the potential V1 in step 206. The sensing circuit 108 charges all the bit lines on the second side of the memory cell to the potential V2 in step 208. The sensing circuit 108 measures the current that flows through the memory cell in step 210. The sensing circuit 108 determines the state of the memory cell based on the current in step 212. The method ends in step 214.

Figure 10:
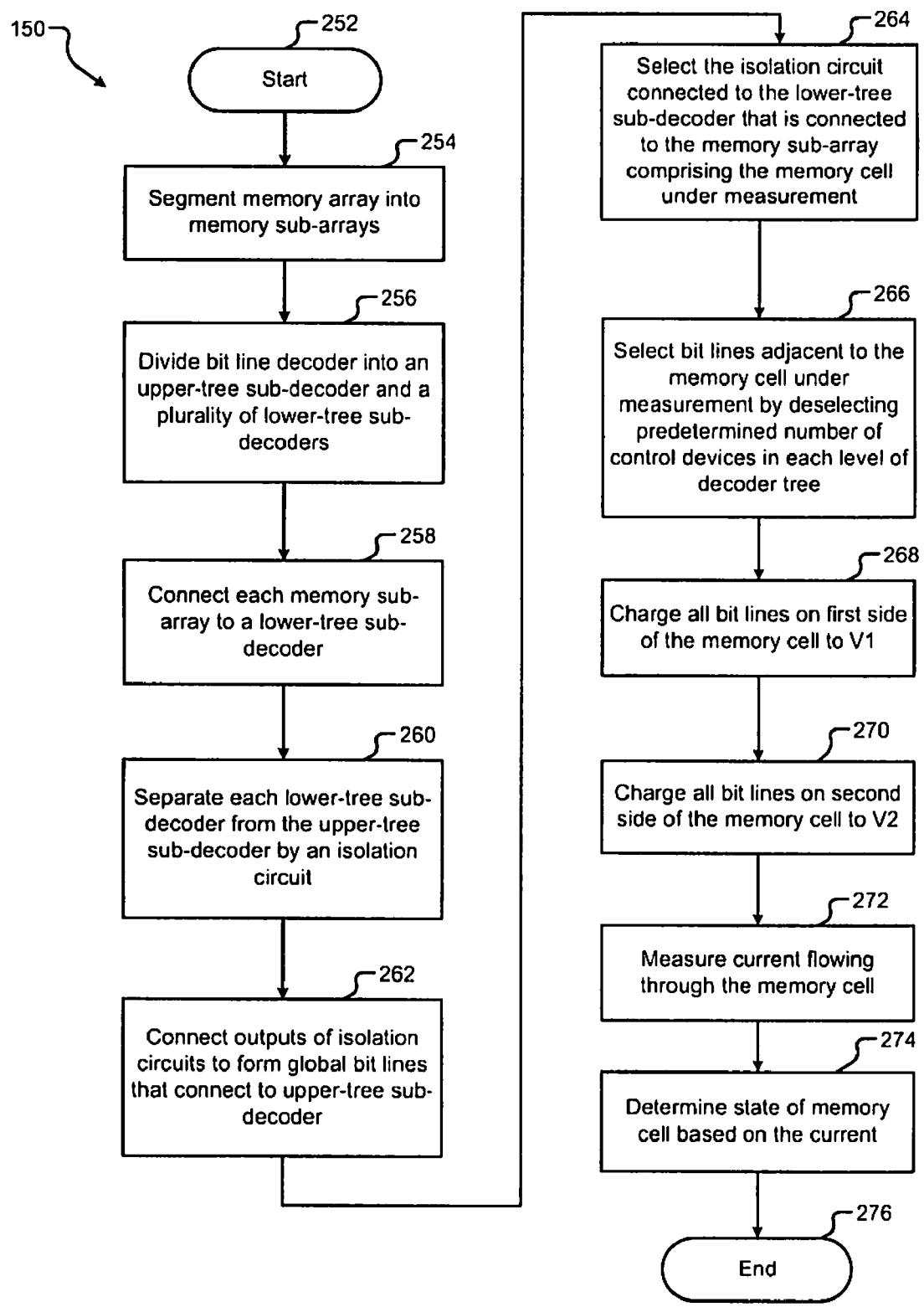
FIG. 10 is a flowchart of an exemplary method for sensing states of memory cells of memory arrays using a bit line decoder according to the present disclosure.

Referring now to FIG. 10, a method 250 for measuring the state of the memory cell of the NOR-type memory array 182 using the bit line decoder 184 begins at step 252. The memory array 182 is segmented into memory sub-arrays 182-1, 182, ..., and 182-N in step 254. The bit line decoder 184 is divided into the upper-tree sub-decoder 190 and the lower-tree sub-decoders 188 in step 256. Each memory sub-array 182-$k$ is connected to one lower-tree sub-decoder 188-$k$ in step 258. In step 260, each lower-tree sub-decoder 188-$k$ is separated (i.e., isolated) from the upper-tree-sub-decoder 190 by isolation circuits 192-$k$. Outputs of the isolation circuits 192 are connected together in step 262 to form global bit lines that connect to the upper-tree sub-decoder 190.

In step 264, the control module 186 selects the isolation circuit 192-$k$ that connects to the memory array 182-$k$ where the memory cell under measurement is located. In step 266, the control module 186 selects the bit lines adjacent to the memory cell by deselecting a predetermined number of control devices in each level of the lower-tree sub-decoder 188-$k$ and the upper-tree sub-decoder 190.

The sensing circuit 108 charges all the bit lines on the first side of the memory cell in the memory sub-array 182-$k$ to the potential V1 in step 268. The sensing circuit 108 charges all the bit lines on the second side of the memory cell in the memory sub-array 182-$k$ to the potential V2 in step 270. The sensing circuit 108 measures the current that flows through the memory cell in step 272. The sensing circuit 108 determines the state of the memory cell based on the current in step 274. The method 250 ends in step 276.

Referring now to FIGS. 11A-11G, various exemplary implementations incorporating the teachings of the present disclosure are shown.

Figure 11A:
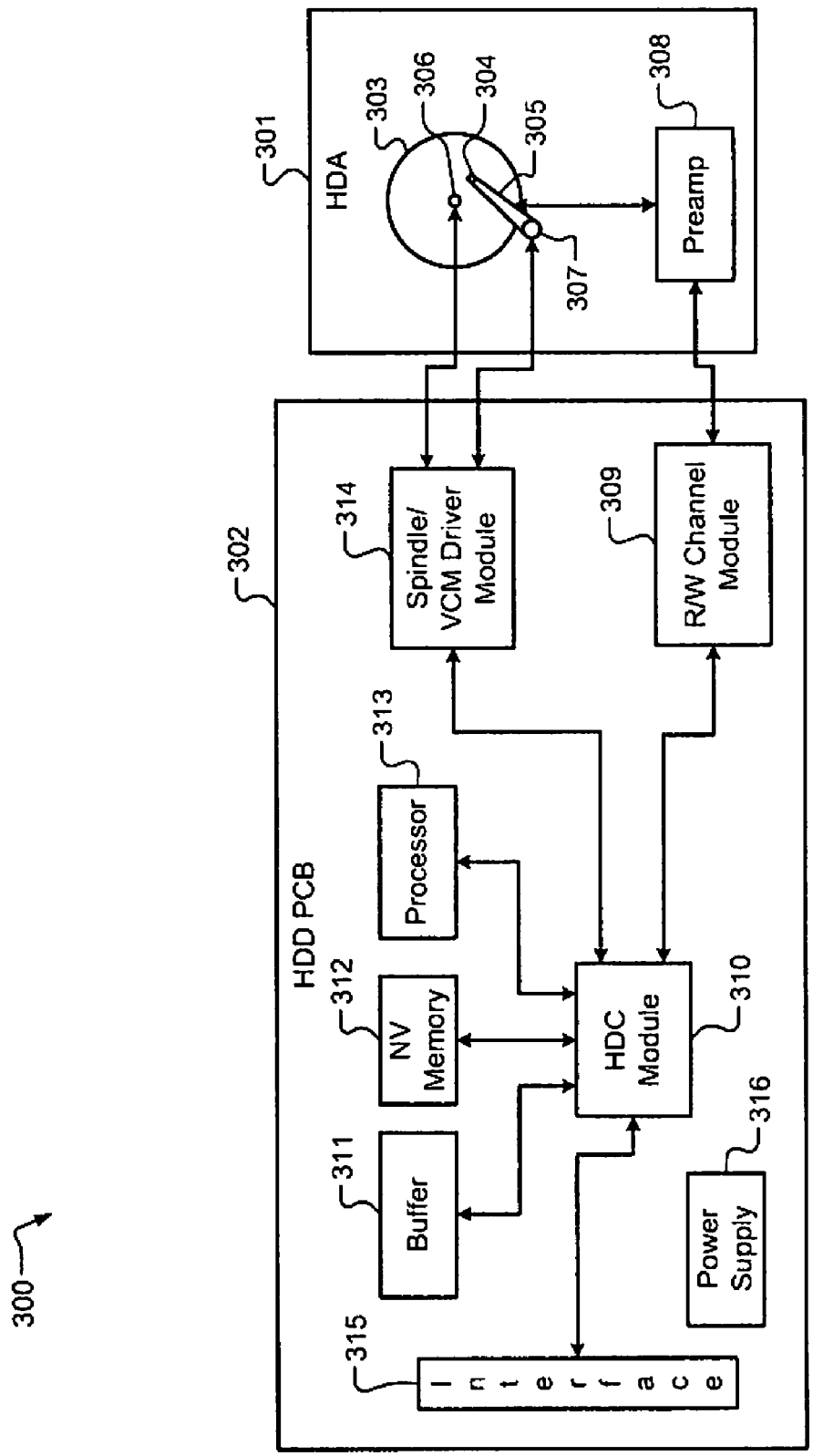
FIG. 11A is a functional block diagram of a hard disk drive.

In FIG. 11A, the teachings of the disclosure can be implemented in nonvolatile memory 312 of a hard disk drive (HDD) 300. The HDD 300 includes a hard disk assembly (HDA) 301 and an HDD printed circuit board (PCB) 302. The HDA 301 may include a magnetic medium 303, such as one or more platters that store data, and a read/write device 304. The read/write device 304 may be arranged on an actuator arm 305 and may read and write data on the magnetic medium 303. Additionally, the HDA 301 includes a spindle motor 306 that rotates the magnetic medium 303 and a voice-coil motor (VCM) 307 that actuates the actuator arm 305. A preamplifier device 308 amplifies signals generated by the read/write device 304 during read operations and provides signals to the read/write device 304 during write operations.

The HDD PCB 302 includes a read/write channel module (hereinafter, "read channel") 309, a hard disk controller (HDC) module 310, a buffer 311, nonvolatile memory 312, a processor 313, and a spindle/VCM driver module 314. The read channel 309 processes data received from and transmitted to the preamplifier device 308. The HDC module 310 controls components of the HDA 301 and communicates with an external device (not shown) via an I/O interface 315. The external device may include a computer, a multimedia device, a mobile computing device, etc. The I/O interface 315 may include wireline and/or wireless communication links.

The HDC module 310 may receive data from the HDA 301, the read channel 309, the buffer 311, nonvolatile memory 312, the processor 313, the spindle/VCM driver module 314, and/or the I/O interface 315. The processor 313 may process the data, including encoding, decoding, filtering, and/or formatting. The processed data may be output to the HDA 301, the read channel 309, the buffer 311, nonvolatile memory 312, the processor 313, the spindle/VCM driver module 314, and/or the I/O interface 315.

The HDC module 310 may use the buffer 311 and/or nonvolatile memory 312 to store data related to the control and operation of the HDD 300. The buffer 311 may include DRAM, SDRAM, etc. Nonvolatile memory 312 may include any suitable type of semiconductor or solid-state memory, such as flash memory (including NAND and NOR flash memory), phase change memory, magnetic RAM, and multi-state memory, in which each memory cell has more than two states. The spindle/VCM driver module 314 controls the spindle motor 306 and the VCM 307. The HDD PCB 302 includes a power supply 316 that provides power to the components of the HDD 300.

Figure 11B:
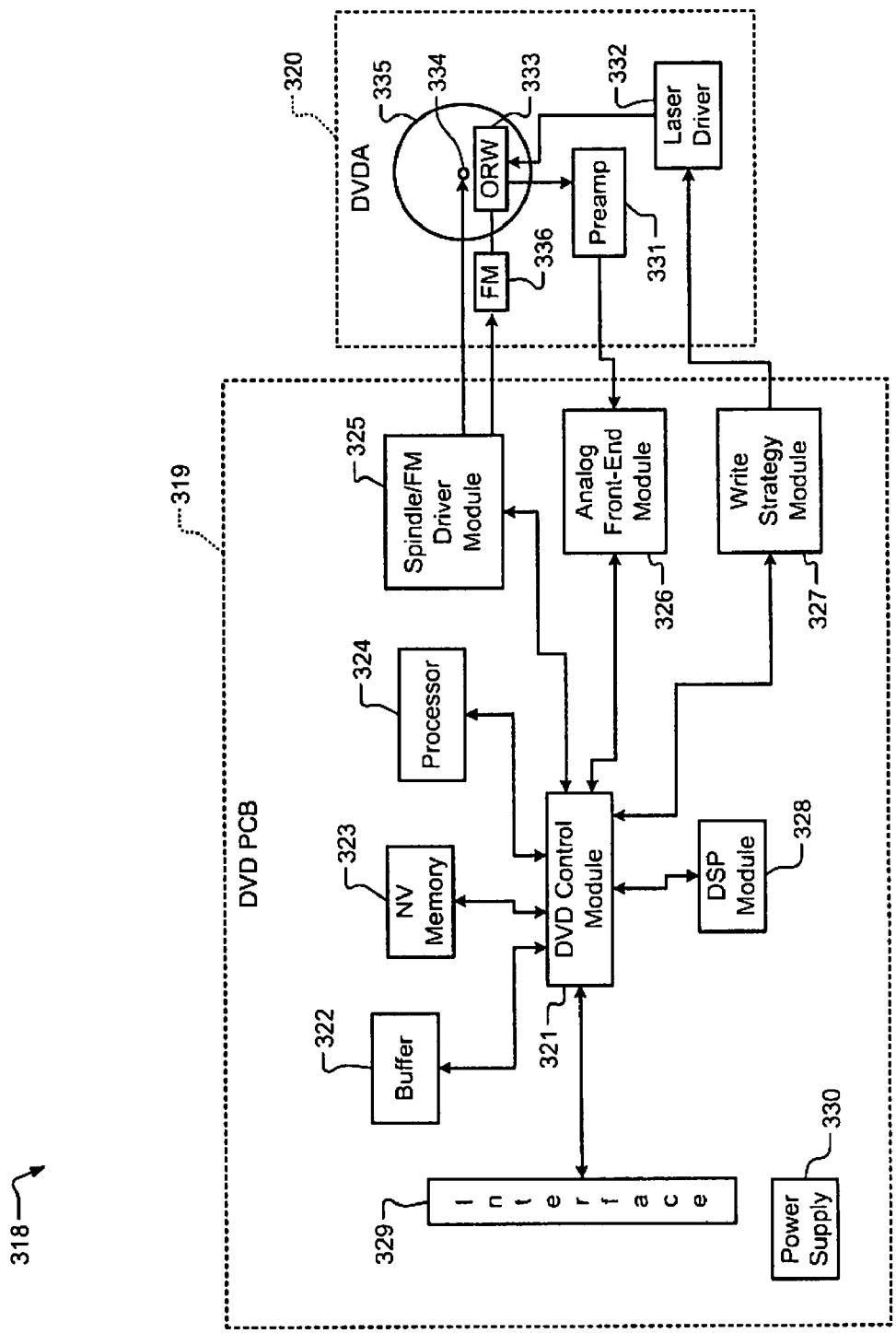
FIG. 11B is a functional block diagram of a DVD drive.

In FIG. 11B, the teachings of the disclosure can be implemented in nonvolatile memory 323 of a DVD drive 318 or of a CD drive (not shown). The DVD drive 318 includes a DVD PCB 319 and a DVD assembly (DVDA) 320. The DVD PCB 319 includes a DVD control module 321, a buffer 322, nonvolatile memory 323, a processor 324, a spindle/FM (feed motor) driver module 325, an analog front-end module 326, a write strategy module 327, and a DSP module 328.

The DVD control module 321 controls components of the DVDA 320 and communicates with an external device (not shown) via an I/O interface 329. The external device may include a computer, a multimedia device, a mobile computing device, etc. The I/O interface 329 may include wireline and/or wireless communication links.

The DVD control module 321 may receive data from the buffer 322, nonvolatile memory 323, the processor 324, the spindle/FM driver module 325, the analog front-end module 326, the write strategy module 327, the DSP module 328, and/or the I/O interface 329. The processor 324 may process the data, including encoding, decoding, filtering, and/or formatting. The DSP module 328 performs signal processing, such as video and/or audio coding/decoding. The processed data may be output to the buffer 322, nonvolatile memory 323, the processor 324, the spindle/FM driver module 325, the analog front-end module 326, the write strategy module 327, the DSP module 328, and/or the I/O interface 329.

The DVD control module 321 may use the buffer 322 and/or nonvolatile memory 323 to store data related to the control and operation of the DVD drive 318. The buffer 322 may include DRAM, SDRAM, etc. Nonvolatile memory 323 may include any suitable type of semiconductor or solid-state memory, such as flash memory (including NAND and NOR flash memory), phase change memory, magnetic RAM, and multi-state memory, in which each memory cell has more than two states. The DVD PCB 319 includes a power supply 330 that provides power to the components of the DVD drive 318.

The DVDA 320 may include a preamplifier device 331, a laser driver 332, and an optical device 333, which may be an optical read/write (ORW) device or an optical read-only (OR) device. A spindle motor 334 rotates an optical storage medium 335, and a feed motor 336 actuates the optical device 333 relative to the optical storage medium 335.

When reading data from the optical storage medium 335, the laser driver provides a read power to the optical device 333. The optical device 333 detects data from the optical storage medium 335, and transmits the data to the preamplifier device 331. The analog front-end module 326 receives data from the preamplifier device 331 and performs such functions as filtering and A/D conversion. To write to the optical storage medium 335, the write strategy module 327 transmits power level and timing data to the laser driver 332. The laser driver 332 controls the optical device 333 to write data to the optical storage medium 335.

Figure 11D:
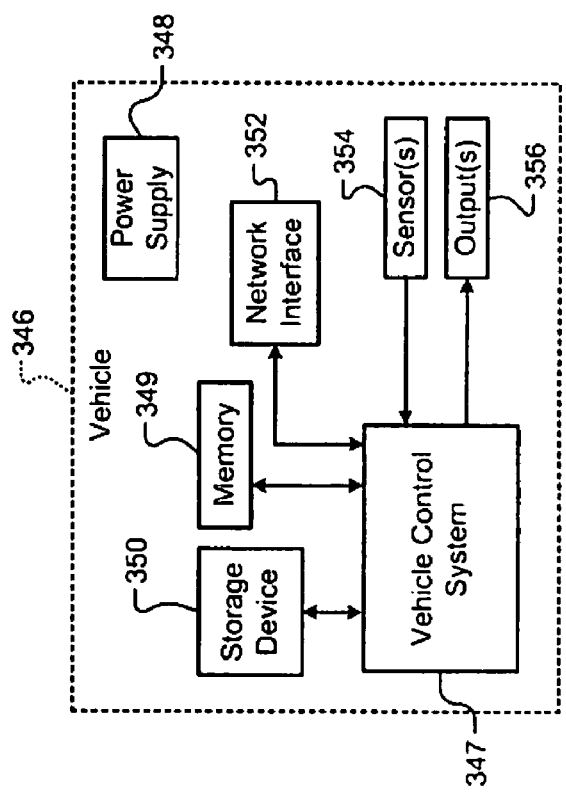
FIG. 11D is a functional block diagram of a vehicle control system.
Figure 11C:
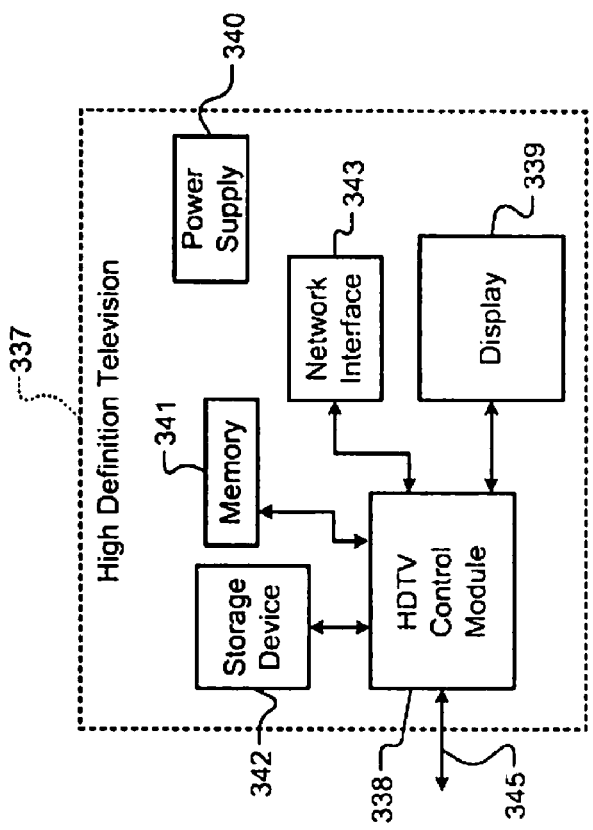
FIG. 11C is a functional block diagram of a high definition television.

In FIG. 11C, the teachings of the disclosure can be implemented in memory 341 of a high definition television (HDTV) 337. The HDTV 337 includes an HDTV control module 338, a display 339, a power supply 340, memory 341, a storage device 342, a network interface 343, and an external interface 345. If the network interface 343 includes a wireless local area network interface, an antenna (not shown) may be included.

The HDTV 337 can receive input signals from the network interface 343 and/or the external interface 345, which can send and receive data via cable, broadband Internet, and/or satellite. The HDTV control module 338 may process the input signals, including encoding, decoding, filtering, and/or formatting, and generate output signals. The output signals may be communicated to one or more of the display 339, memory 341, the storage device 342, the network interface 343, and the external interface 345.

Memory 341 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 342 may include an optical storage drive, such as a DVD drive, and/or a hard disk drive (HDD). The HDTV control module 338 communicates externally via the network interface 343 and/or the external interface 345. The power supply 340 provides power to the components of the HDTV 337.

In FIG. 11D, the teachings of the disclosure may be implemented in memory 349 of a vehicle 346. The vehicle 346 may include a vehicle control system 347, a power supply 348, memory 349, a storage device 350, and a network interface 352. If the network interface 352 includes a wireless local area network interface, an antenna (not shown) may be included. The vehicle control system 347 may be a powertrain control system, a body control system, an entertainment control system, an anti-lock braking system (ABS), a navigation system, a telematics system, a lane departure system, an adaptive cruise control system, etc.

The vehicle control system 347 may communicate with one or more sensors 354 and generate one or more output signals 356. The sensors 354 may include temperature sensors, acceleration sensors, pressure sensors, rotational sensors, airflow sensors, etc. The output signals 356 may control engine operating parameters, transmission operating parameters, suspension parameters, etc.

The power supply 348 provides power to the components of the vehicle 346. The vehicle control system 347 may store data in memory 349 and/or the storage device 350. Memory 349 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 350 may include an optical storage drive, such as a DVD drive, and/or a hard disk drive (HDD). The vehicle control system 347 may communicate externally using the network interface 352.

Figure 11F:
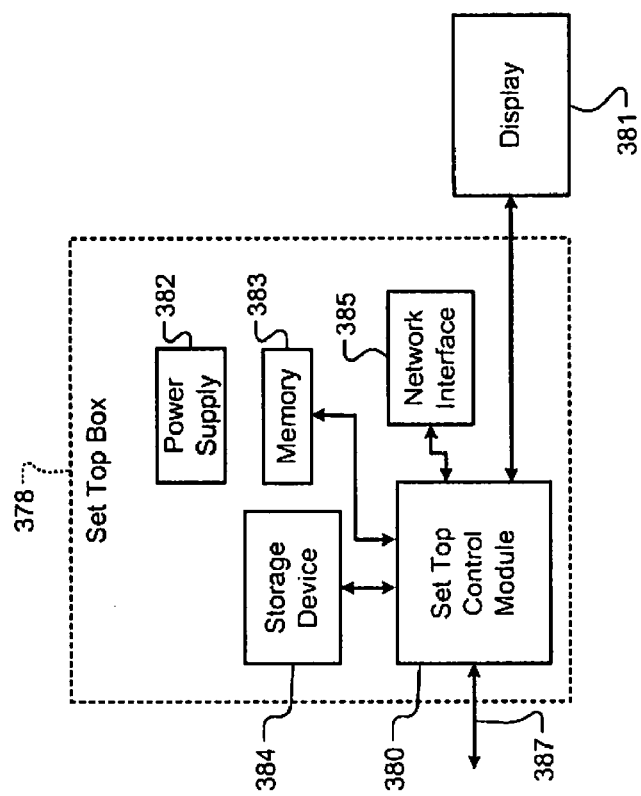
FIG. 11F is a functional block diagram of a set top box.
Figure 11E:
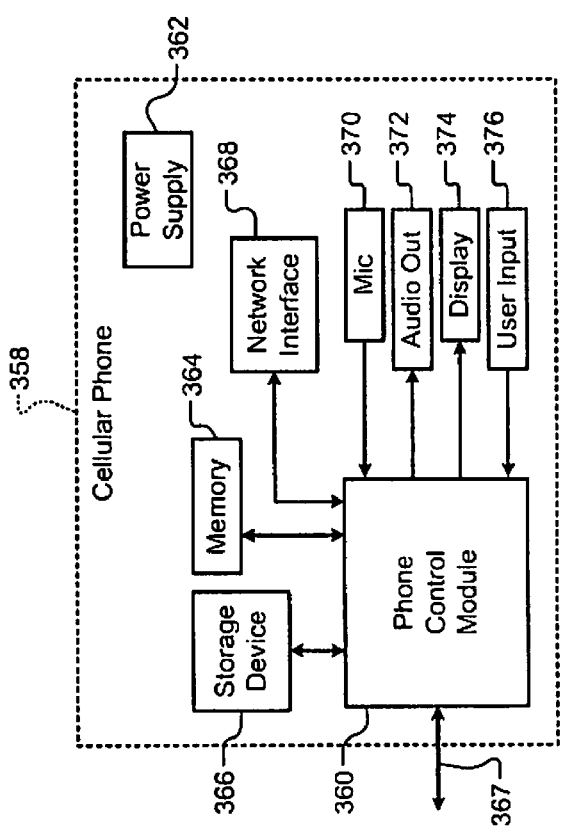
FIG. 11E is a functional block diagram of a cellular phone.

In FIG. 11E, the teachings of the disclosure can be implemented in memory 364 of a cellular phone 358. The cellular phone 358 includes a phone control module 360, a power supply 362, memory 364, a storage device 366, and a cellular network interface 367. The cellular phone 358 may include a network interface 368, a microphone 370, an audio output 372 such as a speaker and/or output jack, a display 374, and a user input device 376 such as a keypad and/or pointing device. If the network interface 368 includes a wireless local area network interface, an antenna (not shown) may be included.

The phone control module 360 may receive input signals from the cellular network interface 367, the network interface 368, the microphone 370, and/or the user input device 376. The phone control module 360 may process signals, including encoding, decoding, filtering, and/or formatting, and generate output signals. The output signals may be communicated to one or more of memory 364, the storage device 366, the cellular network interface 367, the network interface 368, and the audio output 372.

Memory 364 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 366 may include an optical storage drive, such as a DVD drive, and/or a hard disk drive (HDD). The power supply 362 provides power to the components of the cellular phone 358.

In FIG. 11F, the teachings of the disclosure can be implemented in memory 383 of a set top box 378. The set top box 378 includes a set top control module 380, a display 381, a power supply 382, memory 383, a storage device 384, and a network interface 385. If the network interface 385 includes a wireless local area network interface, an antenna (not shown) may be included.

The set top control module 380 may receive input signals from the network interface 385 and an external interface 387, which can send and receive data via cable, broadband Internet, and/or satellite. The set top control module 380 may process signals, including encoding, decoding, filtering, and/or formatting, and generate output signals. The output signals may include audio and/or video signals in standard and/or high definition formats. The output signals may be communicated to the network interface 385 and/or to the display 381. The display 381 may include a television, a projector, and/or a monitor.

The power supply 382 provides power to the components of the set top box 378. Memory 383 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 384 may include an optical storage drive, such as a DVD drive, and/or a hard disk drive (HDD).

Figure 11G:
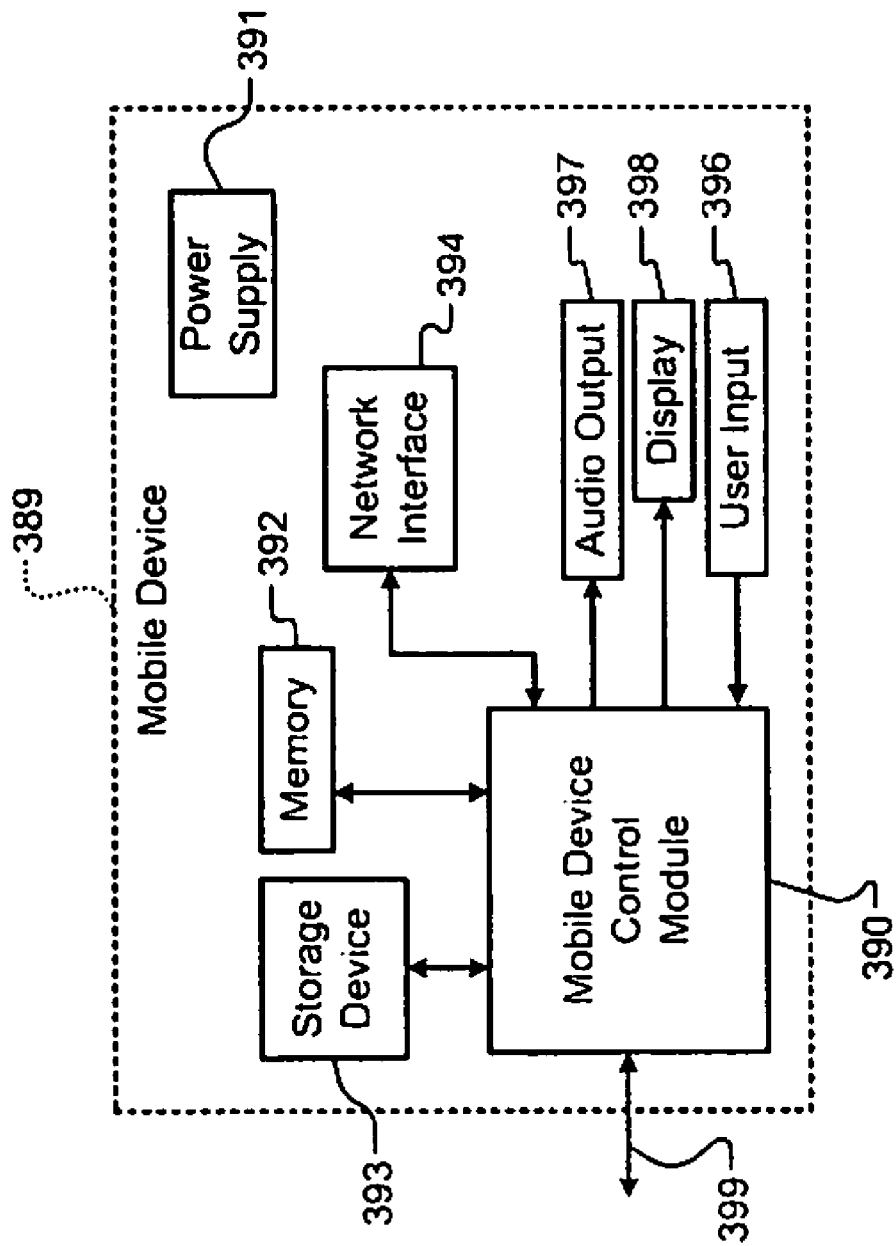
FIG. 11G is a functional block diagram of a mobile device.

In FIG. 11G, the teachings of the disclosure can be implemented in memory 392 of a mobile device 389. The mobile device 389 may include a mobile device control module 390, a power supply 391, memory 392, a storage device 393, a network interface 394, and an external interface 399. If the network interface 394 includes a wireless local area network interface, an antenna (not shown) may be included.

The mobile device control module 390 may receive input signals from the network interface 394 and/or the external interface 399. The external interface 399 may include USB, infrared, and/or Ethernet. The input signals may include compressed audio and/or video, and may be compliant with the MP3 format. Additionally, the mobile device control module 390 may receive input from a user input 396 such as a keypad, touchpad, or individual buttons. The mobile device control module 390 may process input signals, including encoding, decoding, filtering, and/or formatting, and generate output signals.

The mobile device control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the mobile device 389. Memory 392 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 393 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A bit line decoder for sensing states of memory cells of a memory array, the bit line decoder comprising:
   control devices that selectively communicate with bit lines and that are arranged in a multi-level configuration having a plurality of levels, wherein
     each of said levels includes a plurality of said control devices connected to each other in series forming one or more junctions, and
     each of said one or more junctions in one of said levels is directly connected to a respective one of said bit lines;
   a control module that
     selects from said bit lines a first bit line and a second bit line associated with a memory cell located in said memory array when determining a state of said memory cell, and
     generates first control signals that deselect one or more of said control devices at each of said levels,
     wherein when said one or more control devices at each of said levels are deselected, a first group of said bit lines including said first bit line is charged to a first potential and a second group of said bit lines including said second bit line is charged to a second potential; and
   an isolation circuit to isolate a first one of said levels from a second one of said levels, wherein said isolation circuit includes a plurality of isolation devices having (i) first ends that communicate with said control devices of said first one of said levels and (ii) second ends that communicate with said control devices of said second one of said levels.

2. The bit line decoder of claim 1 further comprising a sensing circuit that:
   applies (i) said first potential to said first group of said bit lines and (ii) said second potential to said second group of said bit lines,
   senses current that flows through said memory cell, and
   determines said state of said memory cell based on said current.

3. The bit line decoder of claim 2 wherein a first number of said control devices associated with a first of said levels is greater than a second number of said control devices associated with a second of said levels.

4. The bit line decoder of claim 3 wherein said first of said levels is located farther from said sensing circuit than said second of said levels.

5. The bit line decoder of claim 2 wherein when a first of said levels is adjacent to a second of said levels, a first number of said control devices associated with said first of said levels is twice a second number of said control devices associated with said second of said levels.

6. The bit line decoder of claim 1 wherein said first control signals deselect half of said control devices associated with each of said levels.

7. The bit line decoder of claim 1 wherein said control module generates second control signals that control said isolation circuit, and wherein said isolation circuit isolates said control devices associated with said first one of said levels from said control devices associated with said second one of said levels based on said second control signals.

8. An integrated circuit (IC) comprising:
   the bit line decoder of claim 1; and
   said memory array.

9. A bit line decoder for sensing states of memory cells of a memory array, the bit line decoder comprising:
  control devices arranged in L levels of said bit line decoder, wherein
    said control devices selectively communicate with B bit lines of said memory array,
    a $K^{th}$ of said L levels includes $2^K$ of said control devices, said $2^K$ of said control devices are connected to each other in series forming ($2^K-1$) junctions, and
    (B−2) of said B bit lines are directly connected to said ($2^K-1$) junctions in one of said L levels, where L is an integer greater than 2, $1 \leq K \leq L$, and $B=(2^L+1)$;
  a control module that generates first control signals, wherein said first control signals (i) deselect half of said control devices in each of said L levels and (ii) select two of said B bit lines that communicate with one of said memory cells; and
  an isolation circuit to isolate a first set of said L levels associated with a first sub-decoder from a second set of said L levels associated with a second sub-decoder, wherein said isolation circuit includes a plurality of isolation devices each having (i) first ends that communicate with said first sub-decoder and (ii) second ends that communicate with said second sub-decoder.

10. The bit line decoder of claim 9 further comprising a sensing circuit that:
  communicates with said control devices,
  applies a potential difference across said two of said B bit lines,
  senses current that flows through said one of said memory cells, and
  determines a state of said one of said memory cells based on said current.

11. The bit line decoder of claim 9 further comprising a sensing circuit that:
  communicates with said control devices,
  applies a first potential to M of said B bit lines that are on a first side of said one of said memory cells, and
  applies a second potential to N of said B bit lines that are on a second side of said one of said memory cells, where M and N are integers greater than or equal to 1, and (M+N)=B.

12. The bit line decoder of claim 11 wherein said sensing circuit (i) senses current that flows through said one of said memory cells and (ii) determines a state of said one of said memory cells based on said current.

13. The bit line decoder of claim 11 wherein a first of said L levels includes a greater number of said control devices than a second of said L levels, and wherein said first of said L levels is located farther from said sensing circuit than said second of said L levels.

14. The bit line decoder of claim 11 wherein P of said L levels are arranged in said first sub-decoder that is adjacent to said memory array, and wherein Q of said L levels are arranged in said second sub-decoder that is adjacent to said sensing circuit, where P and Q are integers greater than or equal to 1, and (P+Q)=L.

15. The bit line decoder of claim 9 wherein said control module generates second control signals that control said isolation devices, and wherein said isolation devices isolate said first sub-decoder from said second sub-decoder based on said second control signals.

16. The bit line decoder of claim 15 further comprising a sensing circuit that determines a state of said one of said memory cells when said isolation devices do not isolate said first sub-decoder from said second sub-decoder.

17. An integrated circuit (IC) comprising:
  the bit line decoder of claim 11; and
  said memory array.

18. A bit line decoder for sensing states of memory cells of a memory array, the bit line decoder comprising:
  a first sub-decoder that includes first control devices arranged in P of L levels of said bit line decoder, wherein said first control devices selectively communicate with a first set of S of B bit lines of said memory array,
    a $K^{th}$ of said L levels includes $2^K$ control devices,
    (S−1) of said first control devices in one of said P levels are connected to each other in series forming (S−2) junctions, and
    (S−2) of said S bit lines are directly connected to said (S−2) junctions, where L is an integer greater than 2, P<L, $1 \leq K \leq L$, $S=(2^L+1)$, and S<B;
  a control module that generates first and second control signals, wherein said first control signals deselect half of said first control devices in each of said P levels; and
  an isolation circuit that includes a plurality of isolation devices each having first ends that communicate with said first sub-decoder, and second ends, wherein said first ends selectively communicate with said second ends based on said second control signals.

19. An integrated circuit (IC) comprising:
  the bit line decoder of claim 18; and
  R memory sub-arrays of said memory array, wherein said R memory sub-arrays include:
    a first memory sub-array that includes said first set of S of said B bit lines and that communicates with said first sub-decoder via said first set of S of said B bit lines; and
    (R−1) memory sub-arrays that include (R−1) sets of S of said B bit lines, respectively, where B=S*R, and R is an integer greater than 1,
    wherein said first set of S of said B bit lines and said (R−1) sets of S of said B bit lines provide R sets of S of said B bit lines.

20. The IC of claim 19 further comprising (R−1) of said first sub-decoders that communicate with said (R−1) memory sub-arrays via said (R−1) sets of S of said B bit lines, respectively, where said first sub-decoder and said (R−1) of said first sub-decoders provide R first sub-decoders.

21. The IC of claim 20 further comprising (R−1) of said isolation circuits each having (i) first ends that communicate with said (R−1) of said first sub-decoders, respectively, and (ii) second ends, wherein said second ends of said isolation circuit communicate with corresponding said second ends of said (R−1) of said isolation circuits, and where said isolation circuit and said (R−1) of said isolation circuits provide R isolation circuits.

22. The IC of claim 21 wherein said first ends of one of said R isolation circuits communicate with said second ends of said one of said R isolation circuits based on said second control signals.

23. The IC of claim 22 further comprising a second sub-decoder that includes second control devices arranged in Q of said L levels, the second sub-decoder to communicate with said second ends of said R isolation circuits, and to communicate with each of said R first sub-decoders via respective one of said R isolation circuits, wherein said first control signals deselect half of said second control devices in each of said Q levels, and (P+Q)=L.

24. The IC of claim 23 wherein said first control devices are greater in number than said second control devices, and wherein said first and second sub-decoders are adjacent to said memory array and a sensing circuit, respectively.

25. The IC of claim 23 wherein said first control signals select two bit lines from one of said R sets, and wherein said two bit lines communicate with one of said memory cells located within one of said R memory sub-arrays that communicates with one of said R first sub-decoders via said one of said R sets.

26. The IC of claim 25 further comprising a sensing circuit that communicates with said second sub-decoder, applies a potential difference across said two bit lines, measures current that flows through said one of said memory cells, and determines a state of said one of said memory cells based on said current.

27. The IC of claim 25 further comprising a sensing circuit that applies (i) a first potential to M bit lines from said one of said R sets that are on a first side of said one of said memory cells and (ii) a second potential to N bit lines from said one of said R sets that are on a second side of said one of said memory cells, where M and N are integers greater than or equal to 1, and (M+N)=S.

28. The IC of claim 27 wherein said sensing circuit (i) measures current that flows through said one of said memory cells and (ii) determines said state of said one of said memory cells based on said current.

29. A method for sensing states of memory cells of a memory array, the method comprising:
providing control devices;
arranging said control devices in a multi-level configuration having a plurality of levels;
providing a plurality of said control devices in each of said levels for selectively communicating with bit lines;
connecting, in each of said levels, said plurality of said control devices in series to form one or more junctions;
directly connecting each of said one or more junctions in one of said levels to a respective one of said bit lines;
selecting from said bit lines a first bit line and a second bit line associated with a memory cell located in said memory array when determining a state of said memory cell;
generating first control signals that deselect one or more of said control devices at each of said levels;
charging a first group of said bit fines including said first bit line to a first potential;
charging a second group of said bit lines including said second bit line to a second potential;
providing an isolation circuit to isolate a first one of said levels from a second one of said levels wherein said isolation circuit includes a plurality of isolation devices having first ends and second ends;
communicating with said first ends and said control devices of said first one of said levels; and
communicating with second ends said control devices of said second one of said levels.

30. The method of claim 29 further comprising:
sensing current that flows through said memory cell; and
determining said state of said memory cell based on said current.

31. The method of claim 30 further comprising:
providing a first number of said control devices in a first of said levels; and
providing a second number of said control devices in a second of said levels, wherein said first number is greater than said second number.

32. The method of claim 31 further comprising:
providing a sensing circuit for sensing said current; and
locating said first of said levels farther from said sensing circuit than said second of said levels.

33. The method of claim 30 further comprising:
providing a first number of said control devices in a first of said levels; and
providing a second number of said control devices in a second of said levels, wherein said first number is twice said second number when said first of said levels is adjacent to said second of said levels.

34. The method of claim 29 further comprising deselecting half of said control devices associated with each of said levels based on said first control signals.

35. The method of claim 29 further comprising:
generating second control signals; and
isolating said control devices associated with said first one of said levels from said control devices associated with said second one of said levels based on said second control signals.

36. A method for sensing states of memory cells of a memory array, the method comprising:
providing control devices;
arranging said control devices in L levels of a bit line decoder, where L is an integer greater than 2;
providing $2^K$ of said control devices in a $K^{th}$ of said L levels, where $1 \leq K \leq L$;
selectively communicating with B bit lines of said memory array, where $B=(2^L+1)$;
connecting said $2^K$ of said control devices to each other in series to form $(2^K-1)$ junctions;
directly connecting (B−2) of said B bit lines to said $(2^K-1)$ junctions in one of said L levels;
generating first control signals;
deselecting half of said control devices in each of said L levels based on said first control signals;
selecting two of said B bit lines that communicate with one of said memory cells;
providing an isolation circuit to isolate a first set of said L levels associated with a first sub-decoder from a second set of said L levels associated with a second sub-decoder wherein said isolation circuit includes a plurality of isolation devices each having first ends and second ends;
communicating with said first ends and said first sub-decoder; and
communicating with said second ends and said second sub-decoder.

37. The method of claim 36 further comprising:
applying a potential difference across said two of said B bit lines;
sensing current that flows through said one of said memory cells; and
determining a state of said one of said memory cells based on said current.

38. The method of claim 36 further comprising:
applying a first potential to M of said B bit lines that are on a first side of said one of said memory cells using a sensing circuit; and
applying a second potential to N of said B bit lines that are on a second side of said one of said memory cells using said sensing circuit, where M and N are integers greater than or equal to 1, and (M+N)=B.

39. The method of claim 37 further comprising:
sensing current that flows through said one of said memory cells using said sensing circuit; and
determining a state of said one of said memory cells based on said current using said sensing circuit.

40. The method of claim 38 further comprising:
providing a greater number of said control devices in a first of said L levels than in a second of said L levels; and arranging said first of said L levels farther from said sensing circuit than said second of said L levels.

41. The method of claim 37 further comprising:
arranging P of said L levels in said first sub-decoder that is adjacent to said memory array; and
arranging Q of said L levels in said second sub-decoder that is adjacent to said sensing circuit, where P and Q are integers greater than or equal to 1, and (P+Q)=L.

42. The method of claim 38 further comprising:
generating second control signals that control said isolation devices; and
isolating said first sub-decoder from said second sub-decoder based on said second control signals.

43. The method of claim 42 further comprising determining a state of said one of said memory cells when said isolation devices do not isolate said first sub-decoder from said second sub-decoder.

44. The method of claim 38 further comprising integrating said bit line decoder and said memory array in an integrated circuit (IC).

45. A method for sensing states of memory cells of a memory array, the method comprising:
providing a first sub-decoder that includes first control devices arranged in P of L levels of a bit line decoder, where P and L are integers greater than 2, and P<L;
providing $2^K$ control devices in a $K^{th}$ of said L levels, where $1 \leq K \leq L$;
selectively communicating with a first set of S of B bit lines of said memory array via said first control devices, and where $S=(2^L+1)$, and S<B;
connecting, in one of said P levels, (S−1) of said first control devices to each other in series forming (S−2) junctions;
directly connecting (S−2) of said bit lines to said (S−2) junctions;
generating first and second control signals;
deselecting half of said first control devices in each of said P levels based on said first control signals;
providing an isolation circuit that includes a plurality of isolation devices each having first ends and second ends;
communicating with said first ends and said first sub-decoder; and
selectively communicating with said first ends and said second ends based on said second control signals.

46. The method of claim 45 further comprising:
providing a first memory sub-array including said first set of S of said B bit lines;
communicating with said first memory sub-array and said first sub-decoder via said first set of S of said B bit lines; and
providing (R−1) memory sub-arrays that include (R−1) sets of S of said B bit lines, respectively, where B=S*R, and R is an integer greater than 1,
wherein said first set of S of said B bit lines and said (R−1) sets of S of said B bit lines provide R sets of S of said B bit lines.

47. The method of claim 46 further comprising:
providing (R−1) of said first sub-decoders; and
communicating with said (R−1) memory sub-arrays and said (R−1) of said first sub-decoders via said (R−1) sets of S of said B bit lines, respectively, where said first sub-decoder and said (R−1) of said first sub-decoders provide R first sub-decoders.

48. The method of claim 47 further comprising:
providing (R−1) of said isolation circuits each having first ends and second ends;
communicating with said first ends of said (R−1) of said isolation circuits and said (R−1) of said first sub-decoders, respectively; and
communicating with said second ends of said isolation circuit and corresponding said second ends of said (R−1) of said isolation circuits, where said isolation circuit and said (R−1) of said isolation circuits provide R isolation circuits.

49. The method of claim 48 further comprising communicating with said first ends of one of said R isolation circuits and said second ends of said one of said R isolation circuits based on said second control signals.

50. The method of claim 49 further comprising:
providing a second sub-decoder that includes second control devices arranged in Q of said L levels, where (P+Q)=L;
communicating with said second sub-decoder and said second ends of said R isolation circuits;
deselecting half of said second control devices in each of said Q levels based on said first control signals; and
communicating with said second sub-decoder and each of said R first sub-decoders via respective one of said R isolation circuits.

51. The method of claim 50 further comprising:
providing said first control devices that are greater in number than said second control devices; and
arranging said first and second sub-decoders adjacent to said memory array and a sensing circuit, respectively.

52. The method of claim 50 further comprising:
selecting two bit lines from one of said R sets based on said first control signals; and
communicating with one of said memory cells via said two bit lines, wherein said one of said memory cells is located within one of said R memory sub-arrays that communicates with one of said R first sub-decoders via said one of said R sets.

53. The method of claim 52 further comprising:
providing a sensing circuit;
communicating with said sensing circuit and said second sub-decoder;
applying a potential difference across said two bit lines using said sensing circuit;
measuring current that flows through said one of said memory cells using said sensing circuit; and
determining a state of said one of said memory cells based on said current using said sensing circuit.

54. The method of claim 52 further comprising:
providing a sensing circuit;
applying a first potential to M bit lines from said one of said R sets that are on a first side of said one of said memory cells using said sensing circuit; and
applying a second potential to N bit lines from said one of said R sets that are on a second side of said one of said memory cells using said sensing circuit, where M and N are integers greater than or equal to 1, and (M+N)=S.

55. The method of claim 54 further comprising:
measuring current that flows through said one of said memory cells using said sensing circuit; and
determining said state of said one of said memory cells based on said current using said sensing circuit.

* * * * *